United States Patent
Fujimori et al.

(12)
(10) Patent No.: US 6,756,179 B2
(45) Date of Patent: Jun. 29, 2004

(54) POSITIVE RESIST COMPOSITION

(75) Inventors: Toru Fujimori, Shizuoka (JP);
Kunihiko Kodama, Shizuoka (JP);
Shinichi Kanna, Shizuoka (JP);
Fumiyuki Nishiyama, Shizuoka (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 0 days.

(21) Appl. No.: 09/953,888

(22) Filed: Sep. 18, 2001

(65) Prior Publication Data
US 2002/0058200 A1 May 16, 2002

(30) Foreign Application Priority Data
Sep. 19, 2000 (JP) .................................... P2000-283823

(51) Int. Cl.⁷ ............................ G03C 1/73; G03F 7/039
(52) U.S. Cl. .................... 430/270.1; 430/326; 430/905; 430/909; 430/914; 430/921; 430/925
(58) Field of Search ............................. 430/270.1, 326, 430/905, 914, 921, 925, 909, 919, 920

(56) References Cited

U.S. PATENT DOCUMENTS

| 5,362,599 | A  |   | 11/1994 | Knors et al. |
| 5,558,976 | A  | * | 9/1996  | Urano et al. ................ 430/326 |
| 5,843,624 | A  | * | 12/1998 | Houlihan et al. ........... 430/296 |
| 6,136,500 | A  | * | 10/2000 | Kobayashi et al. ...... 430/270.1 |
| 6,200,728 | B1 | * | 3/2001  | Cameron et al. ........ 430/270.1 |

FOREIGN PATENT DOCUMENTS

JP        11-84661        3/1999        ........... G03F/7/039

* cited by examiner

*Primary Examiner*—Mark F. Huff
*Assistant Examiner*—Sin J. Lee
(74) *Attorney, Agent, or Firm*—Sughrue Mion, PLLC

(57) ABSTRACT

A positive resist composition comprises (A) a resin capable of decomposing by the action of an acid to increase solubility in an alkali developer, and (B) a compound capable of generating an aromatic sulfonic acid substituted with at least one group containing a fluorine atom upon irradiation with one of an actinic ray and radiation.

16 Claims, No Drawings

POSITIVE RESIST COMPOSITION

FIELD OF THE INVENTION

The present invention relates to a positive photosensitive composition for use in the production process of a lithographic printing plate and a semiconductor such as IC, production of a circuit board for liquid crystal and thermal head and in other photofabrication processes.

BACKGROUND OF THE INVENTION

As the photosensitive composition for use in the production process of a lithographic printing plate and a semiconductor such as IC, production of a circuit board for liquid crystal and thermal head and in other photofabrication processes, various compositions are known and photoresist photosensitive compositions are ordinarily employed. The photoresist compositions are widely divided into positive photoresist compositions and negative photoresist compositions.

One of the positive photoresist photosensitive compositions is a chemical amplification-type resist composition as described in U.S. Pat. No. 4,491,628 and European Patent No. 249,139. The chemical amplification-type positive resist composition is a pattern formation material which generates an acid in an exposed area upon irradiation with an active radiation such as a far ultraviolet ray and due to a reaction using the acid as a catalyst, solubility in a developing solution differentiates in the area irradiated with the active radiation from the non-irradiated area to form a pattern on a substrate.

Examples of such a resist composition include combinations of a compound capable of generating an acid by photolysis with an acetal or O,N-acetal compound as described in JP-A-48-89003 (the term "JP-A" as used herein means an "unexamined published Japanese patent application"), with an ortho ester or amide acetal compound as described in JP-A-51-120714, with a polymer having an acetal or ketal group on the main chain as described in JP-A-53-133429, with an enol ether compound as described in JP-A-55-12995, with an N-acyliminocarbonic acid compound as described in JP-A-55-126236, with a polymer having an ortho ester group on the main chain as described in JP-A-56-17345, with a tertiary alkyl ester compound as described in JP-A-60-3625, with a silyl ester compound as described in JP-A-60-10247 or with a silyl ether compound as described in JP-A-60-37549 and JP-A-60-121446. These combinations exhibit high photosensitivity since they have in principle a quantum yield exceeding 1.

A system which is stable during storage at a room temperature but decomposes by heating in the presence of an acid to become alkali-soluble is also known and examples thereof include combinations of a compound capable of generating an acid on exposure with an ester or carbonic acid ester compound having a tertiary or secondary carbon (e.g., tert-butyl or 2-cyclohexenyl) as described, for example, in JP-A-59-45439, JP-A-60-3625, JP-A-62-229242, JP-A-63-27829, JP-A-63-36240, JP-A-63-250642, *Polym. Eng. Sce.*, Vol. 23, page 1012 (1983), *ACS. Sym.*, Vol. 242, page 11 (1984), *Semiconductor World*, November, 1987, page 91, *Macromolecules*, Vol. 21, page 1475 (1988), and *SPIE*, Vol. 920, page 42 (1988). Since such a system has high photosensitivity and a little absorption in a far ultraviolet region, it is suitable for ultra fine fabrication using a light source having a shorter wavelength.

In general, the chemical amplification-type positive resist composition is roughly divided into two types. Specifically, there are a chemical amplification positive resist of three-component type comprising an alkali-soluble resin, a compound capable of generating an acid upon irradiation with a radiation (hereinafter also referred to as a "photo-acid generator" sometimes) and a compound which has an acid-decomposable group and prevents the alkali-soluble resin from dissolution and a chemical amplification positive resist of two-component type comprising a resin having a group capable of being decomposed by a reaction with an acid to become alkali-soluble and a photo-acid generator.

The chemical amplification positive resist composition of two-component or tree-component type is subjected to exposure to generate an acid from the photo-acid generator, heat treatment and development thereby obtaining a resist pattern.

A photo-acid generator which generates pentafluorobenzenesulfonic acid wherein the aromatic ring is directly substituted with fluorine atoms is described, for example, in JP-A-11-84661. However, this compound does not exhibit sufficient results in various characteristics, particularly in view of extraneous substances on surface.

These chemical amplification positive resist compositions are suitable for ultra fine fabrication using a light source having a shorter wavelength as described above. However, reduction of surface roughness, prevention of the occurrence of extraneous substances (micro grains) on surface and further improvement in process allowance such as depth of focus of isolated pattern in resolution of line and space pattern have been desired.

SUMMARY OF THE INVENTION

Therefore, an object of the present invention is to provide a positive resist composition which has a broad range in the depth of focus of isolated pattern and forms a pattern having a smooth surface without extraneous substances and a good rectangular profile.

Other objects of the present invention will become apparent from the following description.

It has been found that the objects of the present invention are accomplished by the following positive resist compositions:

(1) A positive resist composition comprising:

(A) a resin capable of decomposing by the action of an acid to increase solubility in an alkali developer; and (B) a compound capable of generating an aromatic sulfonic acid substituted with at least one group containing a fluorine atom upon irradiation with one of an actinic ray and radiation.

(2) The positive resist composition as described in item (1), which further comprises (D) a compound having a molecular weight of not more than 3,000 which is capable of decomposing by the action of an acid to increase solubility in an alkali developer.

(3) The positive resist composition as described in item (1), which further comprises (F) a nitrogen-containing basic compound.

(4) The positive resist composition as described in item (1), which further comprises (G) a surfactant containing at least one of a fluorine atom and a silicon atom.

(5) The positive resist composition as described in item (1), wherein the compound (B) is a compound represented by any one of formulae (I), (II) and (III):

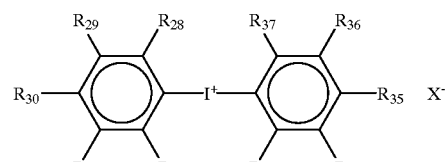
(I)

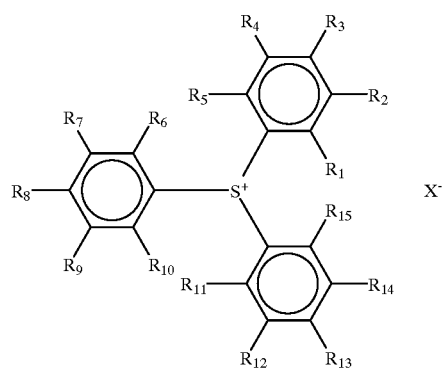
(II)

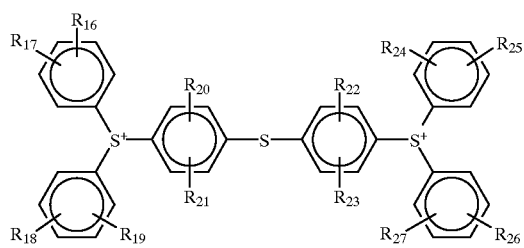
(III)

wherein $R_1$ to $R_{37}$, which are the same or different, each represents a hydrogen atom, a straight-chain, branched or cyclic alkyl group, a straight-chain, branched or cyclic alkoxy group, a hydroxy group, a halogen atom or an —S—$R_{38}$ group; $R_{38}$ represents a straight-chain, branched or cyclic alkyl group or an aryl group; and $X^-$ represents an anion of an aromatic sultonic acid substituted with at least one fluorine atom-containing group.

(6) The positive resist composition as described in item (5), wherein $X^-$ in formula (I), (II) or (III) represents an anion of an aromatic sulfonic acid substituted with at least one perfluoro alkyl group.

(7) The positive resist composition as described in item (1), wherein the resin (A) comprises a resin containing a repeating unit represented by formula (IV) below and a repeating unit represented by formula (V) below:

(IV)

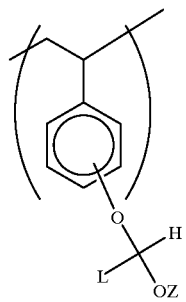

(V)

wherein L represents a hydrogen atom, a straight-chain, branched or cyclic alkyl group which may be substituted or an aralkyl group which may be substituted; Z represents a straight-chain, branched or cyclic alkyl group which may be substituted or an aralkyl group which may be substituted; Z and L may be combined with each other to form a 5-membered or 6-membered ring.

(8) The positive resist composition as described in item (7), wherein Z in formula (IV) represents a substituted alkyl group or a substituted aralkyl group.

(9) The positive resist composition as described in item (7), wherein the resin (A) comprises:

the first resin containing a repeating unit represented by formula (IV), wherein Z in formula (IV) represents a substituted alkyl group or a substituted aralkyl group, and a repeating unit represented by formula (V); and the second resin containing a repeating unit represented by formula (IV), wherein Z in formula (IV) represents an alkyl group, and a repeating unit represented by formula (V).

(10) The positive resist composition as described in item (1), which further comprises (C) a compound other than the compound (B), which is capable of generating an acid upon irradiation with one of an actinic ray and radiation.

(11) The positive resist composition as described in item (10), wherein the compound (C) comprises (C1) a compound other than the compound of component (B), which is capable of generating a sulfonic acid upon irradiation with one of an actinic ray and radiation.

(12) The positive resist composition as described in item (10), wherein the compound (C) contains a compound capable of generating a carboxylic acid upon irradiation with one of an actinic ray and radiation.

(13) The positive resist composition as described in item (12), wherein the carboxylic acid is one of a saturated aliphatic carboxylic acid and an aromatic carboxylic acid.

(14) The positive resist composition as described in item (13), wherein each of the saturated aliphatic carboxylic acid and the aromatic carboxylic acid is substituted by at least one fluorine atom.

(15) The positive resist composition as described in item (1), wherein the group containing a fluorine atom is a hydrocarbon group containing a fluorine atom.

(16) The positive resist composition as described in item (15), wherein the hydrocarbon group containing a fluorine atom has 1 to 15 carbon atoms and 1 to 31 fluorine atoms.

(17) The positive resist composition as described in item (1), wherein the aromatic sulfonic acid is substituted with at least two hydrocarbon groups containing a fluorine atom.

(18) The positive resist composition as described in item (1), wherein the aromatic sulfonic acid is a benzenesulfonic acid.

(19) The positive resist composition as described in item (1), wherein the compound (B) is at least one selected from the group consisting of an onium salt compound, an imidosulfonate compound having a sulfonic acid ester and nitrobenzyl ester compound, each of which is capable of generating an aromatic sulfonic acid substituted with at least one fluorine atom-containing group upon irradiation with one of an actinic ray and radiation.

DETAILED DESCRIPTION OF THE INVENTION

The positive resist composition of the present invention includes (I) a positive resist composition comprising (A) a resin capable of decomposing by the action of an acid to increase solubility in an alkali developer; and (B) a compound capable of generating an aromatic sulfonic acid substituted with at least one fluorine atom-containing group upon irradiation with one of an actinic ray and radiation as the indispensable components (hereinafter also referred to as a "first composition") and (II) a positive resist composition comprising (B) a compound capable of generating an aromatic sulfonic acid substituted with at least one fluorine atom-containing group upon irradiation with one of an actinic ray and radiation, (D) a compound having a molecular weight of not more than 3,000 which is capable of decomposing by the action of an acid to increase solubility in an alkali developer and (E) an alkaline-soluble resin as the indispensable components (hereinafter also referred to as a "second composition").

The term "positive resist composition" or "composition" used hereinafter includes both the first composition and the second composition.

The components including the compounds and resins for use in the positive resist composition of the present invention will be described in greater detail below.

[1] (B) A compound capable of generating an aromatic sulfonic acid substituted with at least one fluorine atom-containing group upon irradiation with one of an actinic ray and radiation (Component (B)):

The fluorine atom-containing group may be any of substituents having a fluorine atom which can be substituted on an aromatic ring of the aromatic sulfonic acid and includes preferably a fluorine atom-containing hydrocarbon group. However, it should be noted that the term "fluorine atom-containing group" dose not include a fluorine atom per se.

The fluorine atom-containing hydrocarbon group has ordinarily from 1 to 15 carbon atoms, preferably from 1 to 11 carbon atoms, and ordinarily from 1 to 31 fluorine atoms, preferably from 1 to 23 fluorine atoms.

Examples of the fluorine atom-containing hydrocarbon group include hydrocarbon groups, for example, alkyl groups, alkoxy groups, aryl groups and aralkyl groups, the hydrogen atom(s) of which are substituted with fluorine atom(s).

The fluorine atom-containing hydrocarbon group may be further substituted, for example, with a hydroxy group, an alkyl group (preferably having from 1 to 8 carbon atoms), an alkoxy group (preferably having from 1 to 8 carbon atoms) or a halogen atom.

Also, the fluorine atom-containing hydrocarbon group may be bonded to the aromatic ring of the aromatic sulfonic acid through a linking group other than a carbon atom, for example, in the case of a trifloromethylsulfinyl group or a trifloromethyloxy group. Examples of the linking group include —S(=O)$_2$—, —O—, —NH—, —NR— (wherein R represents an alkyl group, an aralkyl group or an aryl group), —S— and —C (=O)—O—. Further, a fluorine atom may be bonded to an atom other than a carbon atom in the fluorine atom-containing group.

Examples of the aromatic ring of the aromatic sulfonic acid include a benzene ring and a naphthalene ring. The aromatic ring may have one or more other substituents in addition to the fluorine atom-containing group. Examples of such a substituent include a sulfonic acid group, a halogen atom, an alkyl group (preferably having from 1 to 10 carbon atoms), an alkoxy group (preferably having from 1 to 10 carbon atoms) and an acyl group (preferably having from 1 to 10 carbon atoms).

When the aromatic sulfonic acid generated has one fluorine atom-containing group, it is preferred to have at least one substituent other than the fluorine atom-containing group. More preferably, the aromatic sulfonic acid generated has two or more fluorine atom-containing groups.

Specific examples of the fluorine atom-containing group include monofluoromethyl, difluoromethyl, trifluoromethyl, 2-fluoroethyl, 2,2-difluoroethyl, 2,2,2-trifluoroethyl, 1-fluoroethyl, 1,1-difluoroethyl, 1,2-difluoroethyl, 1,1,2,2,2-pentafluoroethyl, 3-fluoropropyl, 3,3-difluoropropyl, 3,3,3-trifluoropropyl, 2,2,3,3,3-pentafluoropropyl, 1,1,2,2,3,3,3-heptafluoropropyl, 1-fluorobutyl, 2-fluorobutyl, 3-fluorobutyl, 4-fluorobutyl, 1,1-difluorobutyl, 1,2-difluorobutyl, 1,3-difluorobutyl, 1,4-difluorobutyl, 1,1,1-trifluorobutyl, 1,1,1,2,2-pentafluorobutyl, 1,1,1,2,2,3,3-heptafluorobutyl, 1,1,1, 2,2,3,3,4,4-nonafluorobutyl, 1-fluoropentyl, 2-fluoropentyl, 3-fluoropentyl, 4-fluoropentyl, 5-fluoropentyl, 1,1,1-trifluoropentyl, 1,1,1,2, 2-pentafluoropentyl, 1,1,1,2,2,3,3-heptafluoropentyl, 1,1,1, 2,2,3,3,4,4-nonafluoropentyl, 1,1,1,2,2,3,3,4,4,5,5-undecafluoropentyl, and perfluoro alkyl groups having 6 or more carbon atoms, however, the present invention should not be construed as being limited thereto.

The aromatic sulfonic acid substituted with a fluorine atom-containing group includes preferably benzenesulfonic acids having at least one of the fluorine atom-containing groups, more preferably benzenesulfonic acids having two or more of the fluorine atom-containing groups.

Specific examples of the aromatic sulfonic acid substituted with a fluorine atom-containing group include 3,5-bis(trifluoromethyl)benzenesulfonic acid, 2,4,6-tris(trifluoromethyl)benzenesulfonic acid, 3,5-bis(pentafluoroethyl)benzenesulfonic acid, 2,4,6-tris(pentafluoroethyl)benzenesulfonic acid, 3,5-bis(2,2,2-trifluoroethyl) benzenesulfonic acid, 2,4,6-tris(2,2,2-trifluoroethyl) benzenesulfonic acid, 3,5-bis(perfluoropropyl)benzenesulfonic acid, 2,4,6-tris(perfluoropropyl)benzenesulfonic acid, 3,5-bis (3,3,4,4,5,5,5-heptafluoropentyl)benzenesulfonic acid, 2,4,6-tris(3,3,4,4,5,5,5-heptafluoropentyl)benzenesulfonic acid, 3,5-bis(trifluoroacetyl)benzenesulfonic acid, 2,4,6-tris(trifluoroacetyl)benzenesulfonic acid, 3,5-bis(perfluoroglutaryl)benzenesulfonic acid, 2,4,6-tris(perfluoroglutaryl)benzenesulfonic acid, 2,3,4,5,6-pentakis(trifluoromethyl)benzenesulfonic acid, 2,3,4,5,6-pentakis(trifluoroacetyl)benzenesulfonic acid, and these sulfonoc acids may have further substituent(s).

Of the aromatic sulfonic acids substituted with a fluorine atom-containing group, 3,5-bis(trifluoroacetyl) benzenesulfonic acid, 3,5-bis(perfluoroalkyl) benzenesulfonic acid and 3,5-bis(trifluoroacetyl) benzenesulfonic acid are preferred.

The compound which generates an aromatic sulfonic acid substituted with a fluorine atom-containing group includes an onium salt compound (e.g., sulfonium salt or iodonium salt) having an anion of the aromatic sulfonic acid substituted with a fluorine atom-containing group described above as a counter anion, an imidosulfonate compound having a sulfonic acid ester group and a nitrobenzyl ester compound.

The compounds represented by formula (I), (II) or (III) described above are more preferred for the compound of component (B). These compounds are excellent in further improvements in resolution, extraneous substances on surface, profile and depth of focus. The compound generates an aromatic sulfonic acid substituted with at least one fluorine atom-containing group corresponding to $X^-$ in formula (I), (II) or (III) upon irradiation with an actinic ray or radiation thereby acting as a photo-acid generator.

In formulae (I), (II) and (III), examples of the straight-chain or branched alkyl group represented by any one of $R_1$ to $R_{38}$ include those having from 1 to 4 carbon atoms (e.g., a methyl group, an ethyl group, a propyl group, an n-butyl group, a sec-butyl group and a tert-butyl group) which may have a substituent. Examples of the cyclic alkyl group represented by any one of $R_1$ to $R_{38}$ include those having from 3 to 8 carbon atoms (e.g., a cyclopropyl group, a cyclopentyl group and a cyclohexyl group) which may have a substituent.

Examples of the straight-chain or branched alkoxyl group represented by any one of $R_1$ to $R_{37}$ include those having from 1 to 4 carbon atoms (e.g., a methoxy group, an ethoxy group, a hydroxyethoxy group, a propoxy group, an n-butoxy group, an isobutoxy group, a sec-butoxy group, and a tert-butoxy group) which may have a substituent.

Examples of the cyclic alkoxyl group represented by any one of $R_1$ to $R_{37}$ include cyclopentyloxy group and cyclohexyloxy group.

Examples of the halogen atom represented by any one of $R_1$ to $R_{37}$ include a fluorine atom, a chlorine atom, a bromine atom and an iodine atom.

Example of the aryl group represented by $R_{38}$ include those having from 6 to 14 carbon atoms which may have a substituent (e.g., a phenyl group, a tolyl group, a methoxyphenyl group, and a naphthyl group).

Examples of the substituent for the above-described group include an alkoxyl group having from 1 to 4 carbon atoms, a halogen atom (e.g., a fluorine atom, a chlorine atom or an iodine atom), an aryl group having from 6 to 10 carbon atoms, an alkenyl group having from 2 to 6 carbon atoms, a cyano group, a hydroxy group, a carboxy group, an ankoxycarbonyl group and a nitro group.

The iodonium compound or sulfonium compound represented by formula (I), (II) or (III) for use in the present invention has an anion of the aromatic sulfonic acid substituted with at least one fluorine atom-containing group as the counter anion represented by $X^-$. Such an anion is an anion ($-SO_3^-$) formed by releasing a hydrogen atom from the aromatic sulfonic acid ($-SO_3H$).

Specific examples of the compound (photo-acid generator) of component (B) are set forth below, however, the present invention should not be construed as being limited thereto.

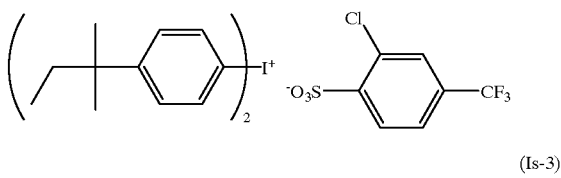
(Is-1)

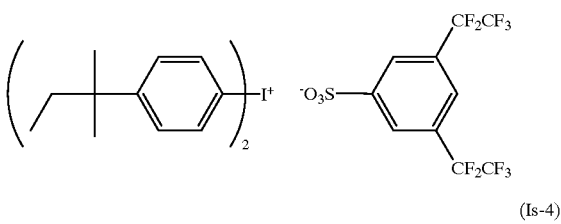
(Is-2)

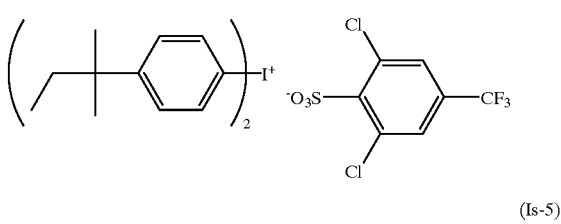
(Is-3)

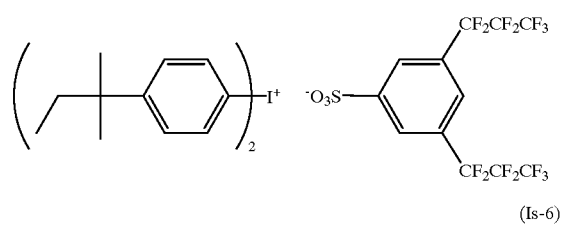
(Is-4)

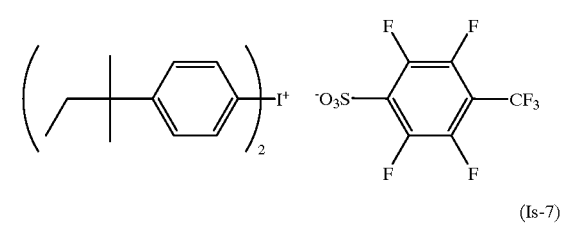
(Is-5)

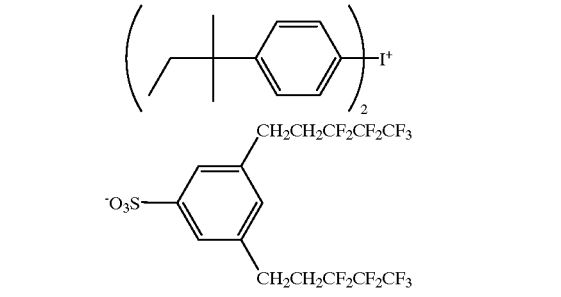
(Is-6)

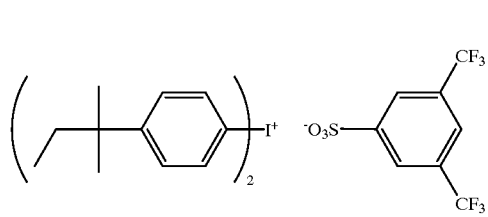
(Is-7)

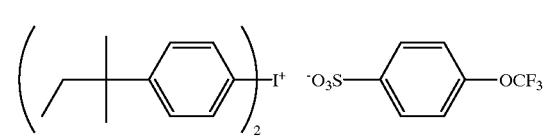
(Is-8)

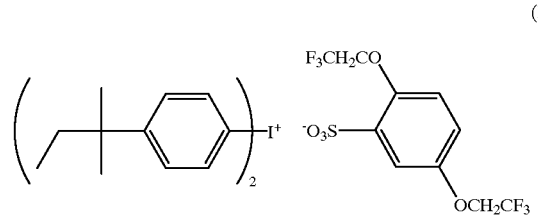
(Is-9)
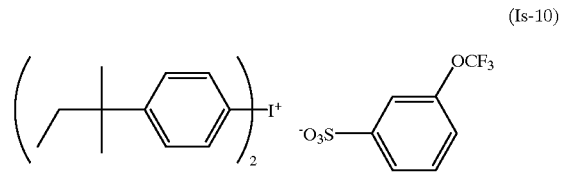
(Is-10)
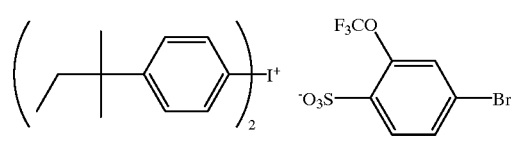
(Is-11)
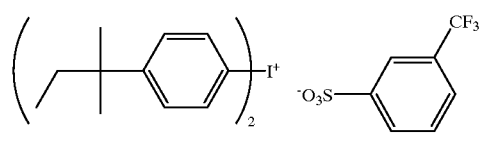
(Is-12)
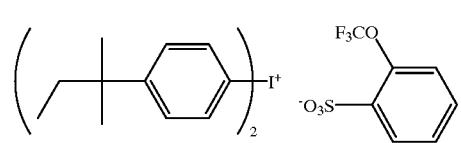
(Is-13)
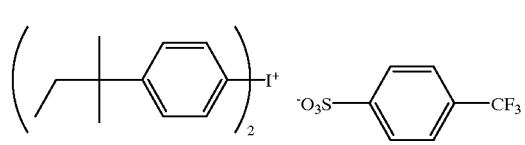
(Is-14)
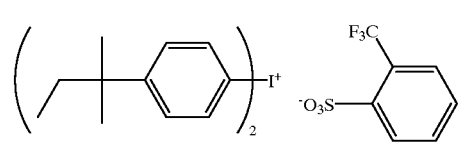
(Is-15)
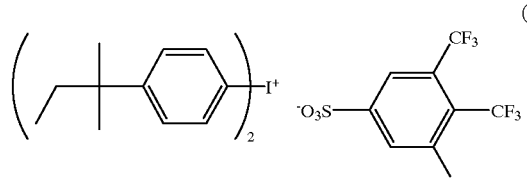
(Is-16)
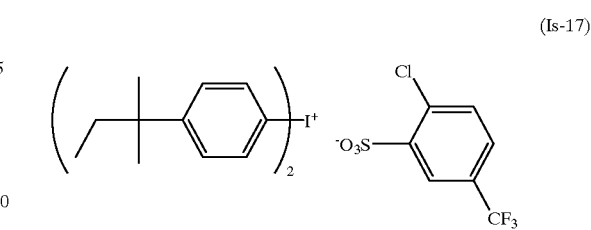
(Is-17)
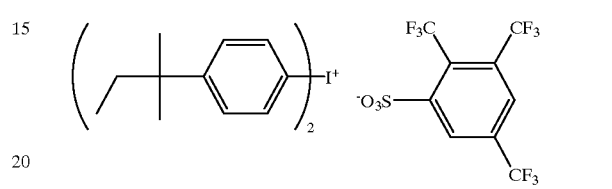
(Is-18)
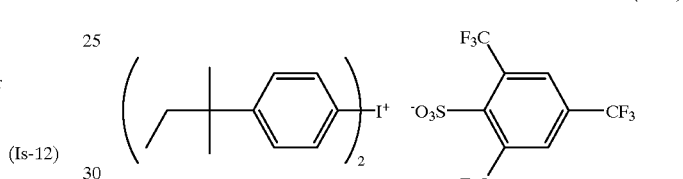
(Is-19)
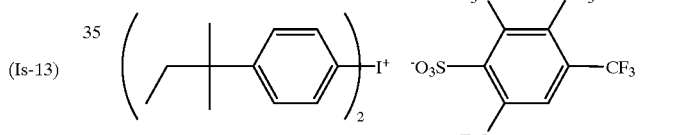
(Is-20)
(Is-21)
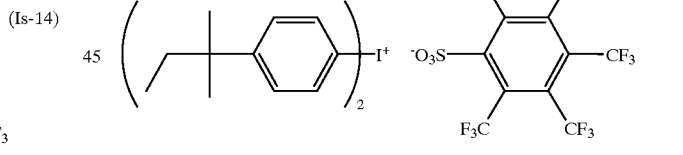
(Is-22)
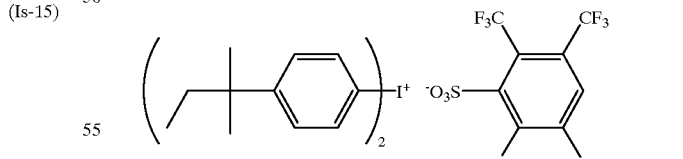
(Is-23)
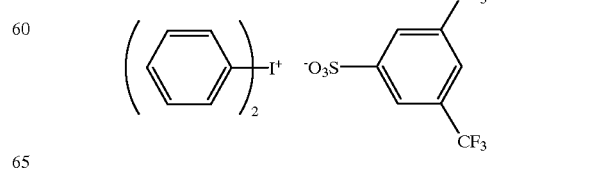

(Is-24) 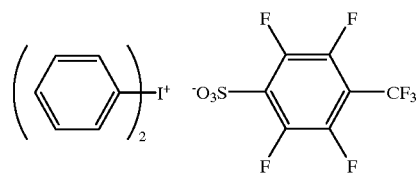
(Is-25) 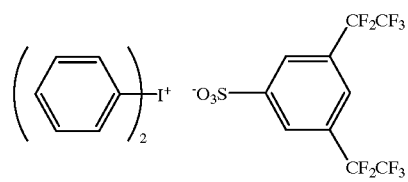
(Is-26) 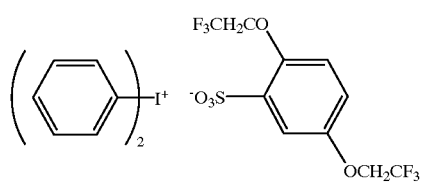
(Is-27) 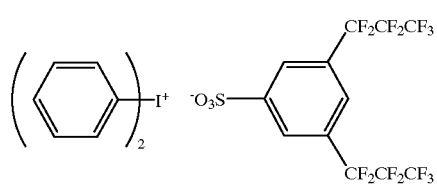
(Is-28) 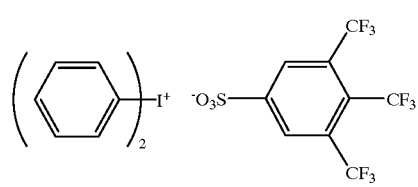
(Is-29) 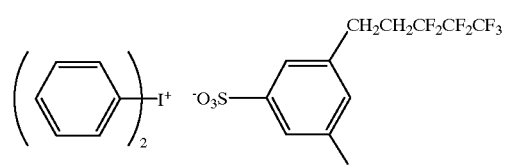
(Is-30) 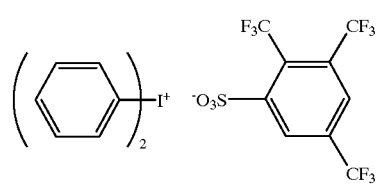
(Is-31) 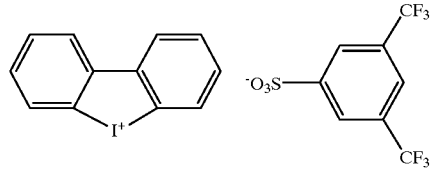
(Is-32) 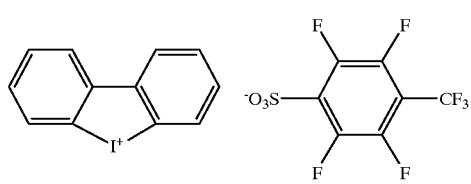
(Is-33) 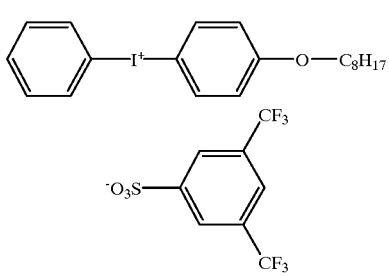
(Is-34) 
(IIs-1) 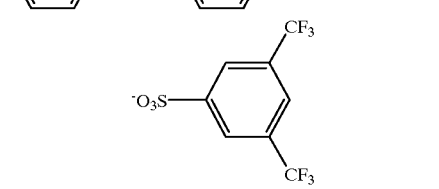
(IIs-2) 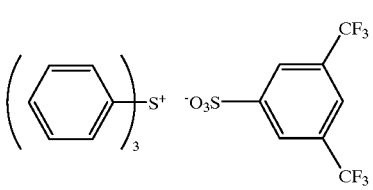
(IIs-3) 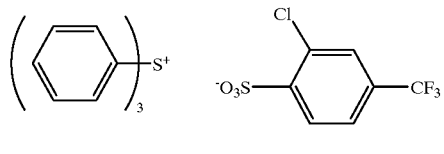
(IIs-4) 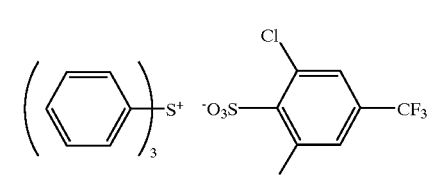

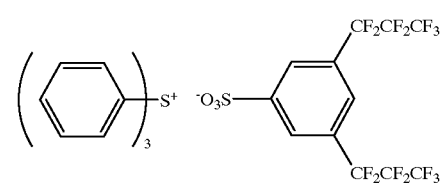
(IIs-5)
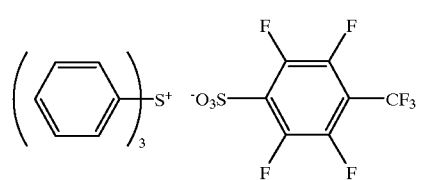
(IIs-6)
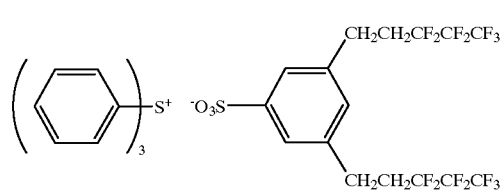
(IIs-7)
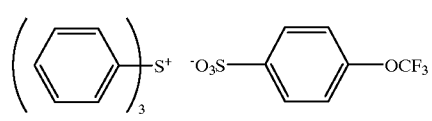
(IIs-8)
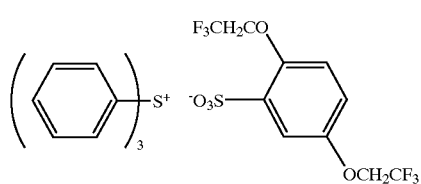
(IIs-9)
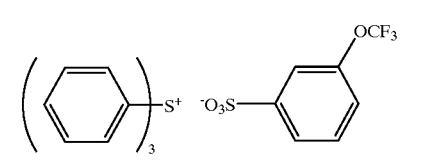
(IIs-10)
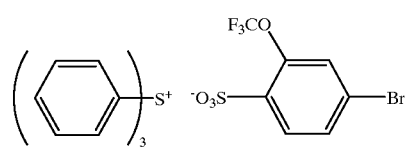
(IIs-11)
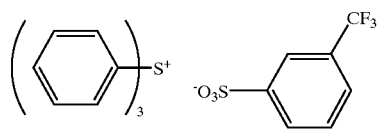
(IIs-12)
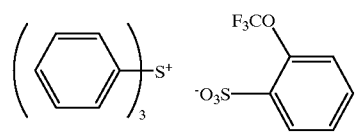
(IIs-13)
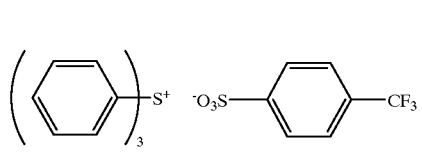
(IIs-14)
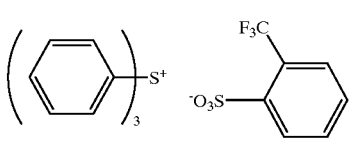
(IIs-15)
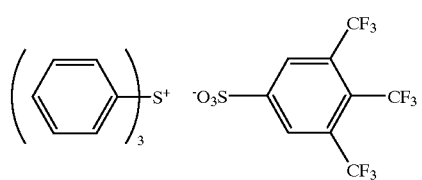
(IIs-16)
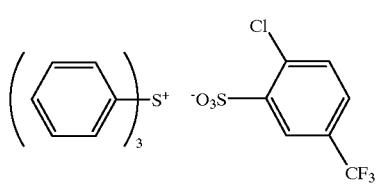
(IIs-17)
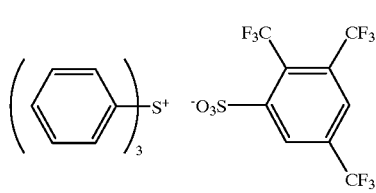
(IIs-18)
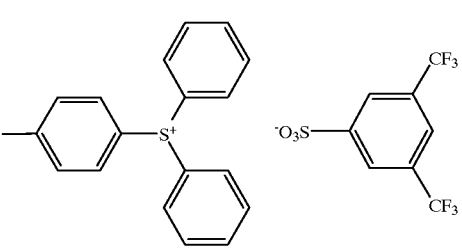
(IIs-19)
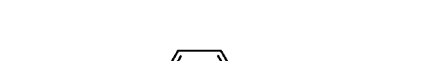
(IIs-20)

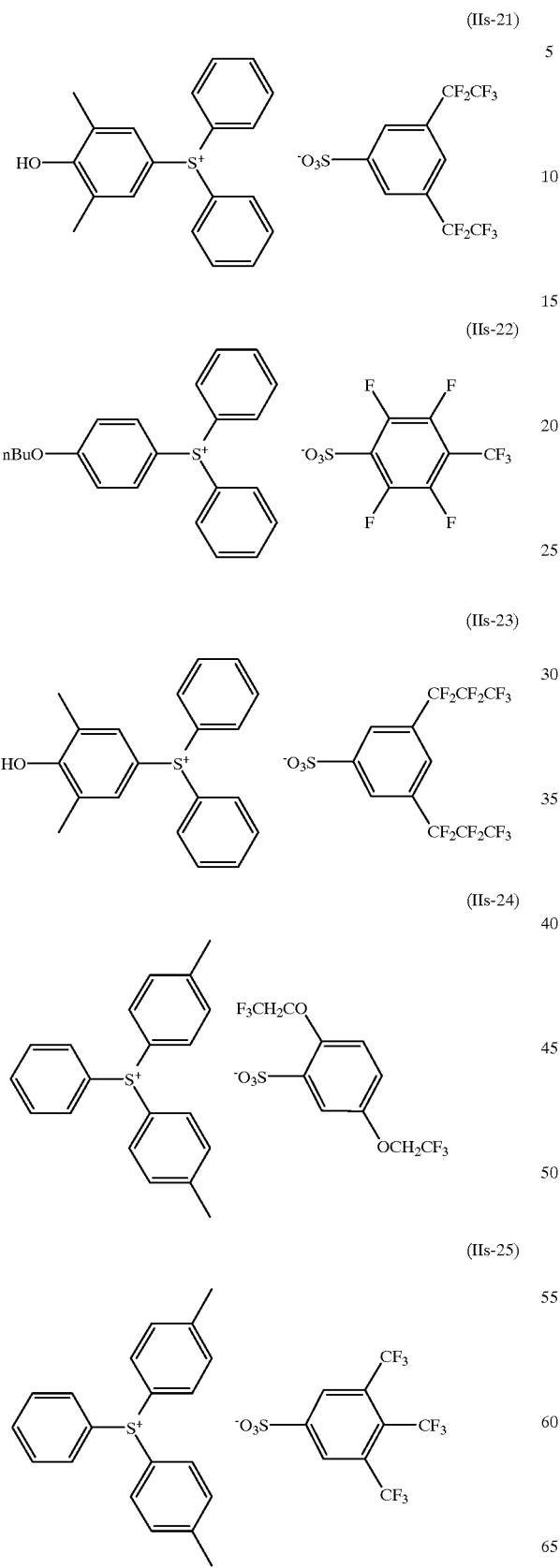
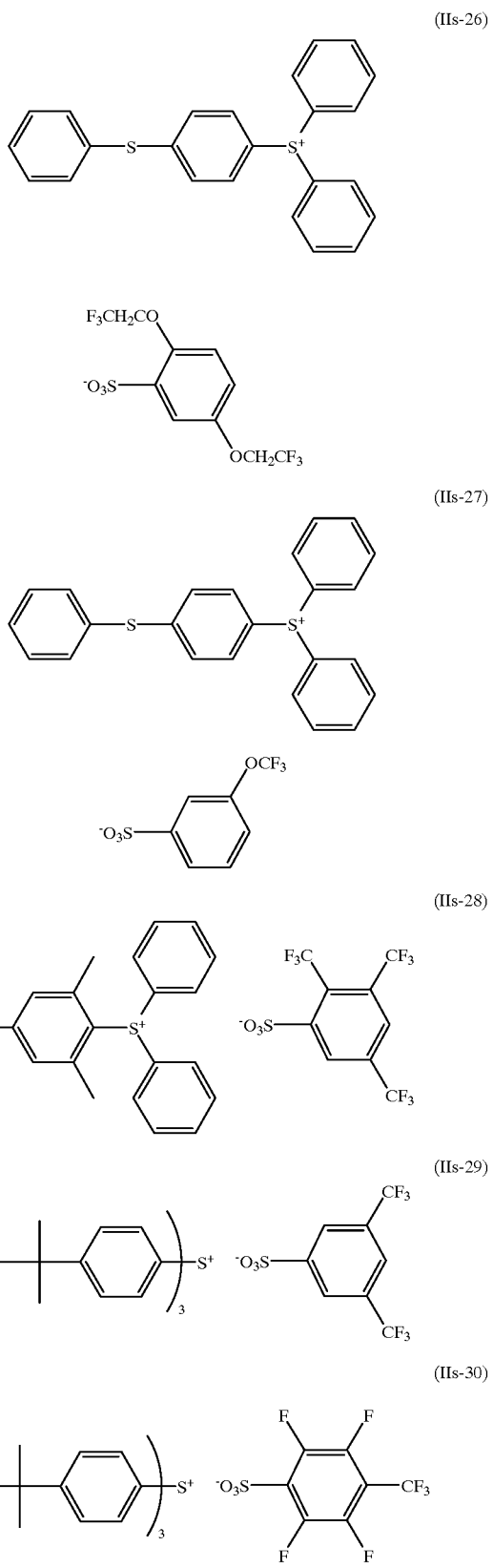

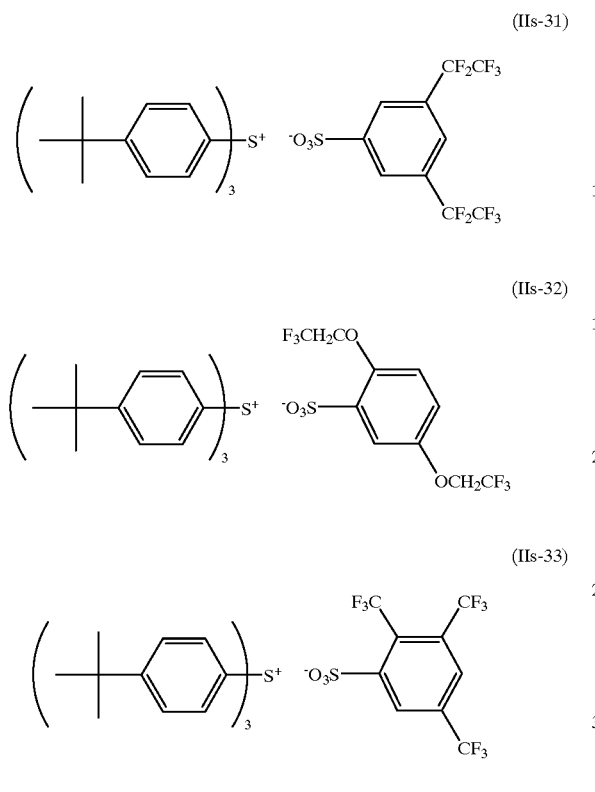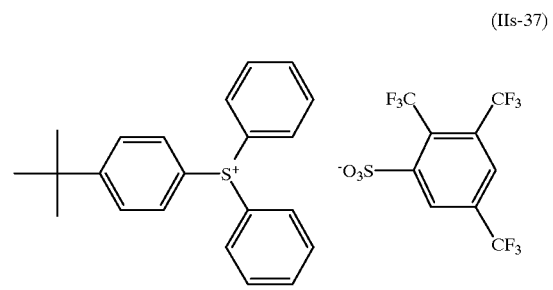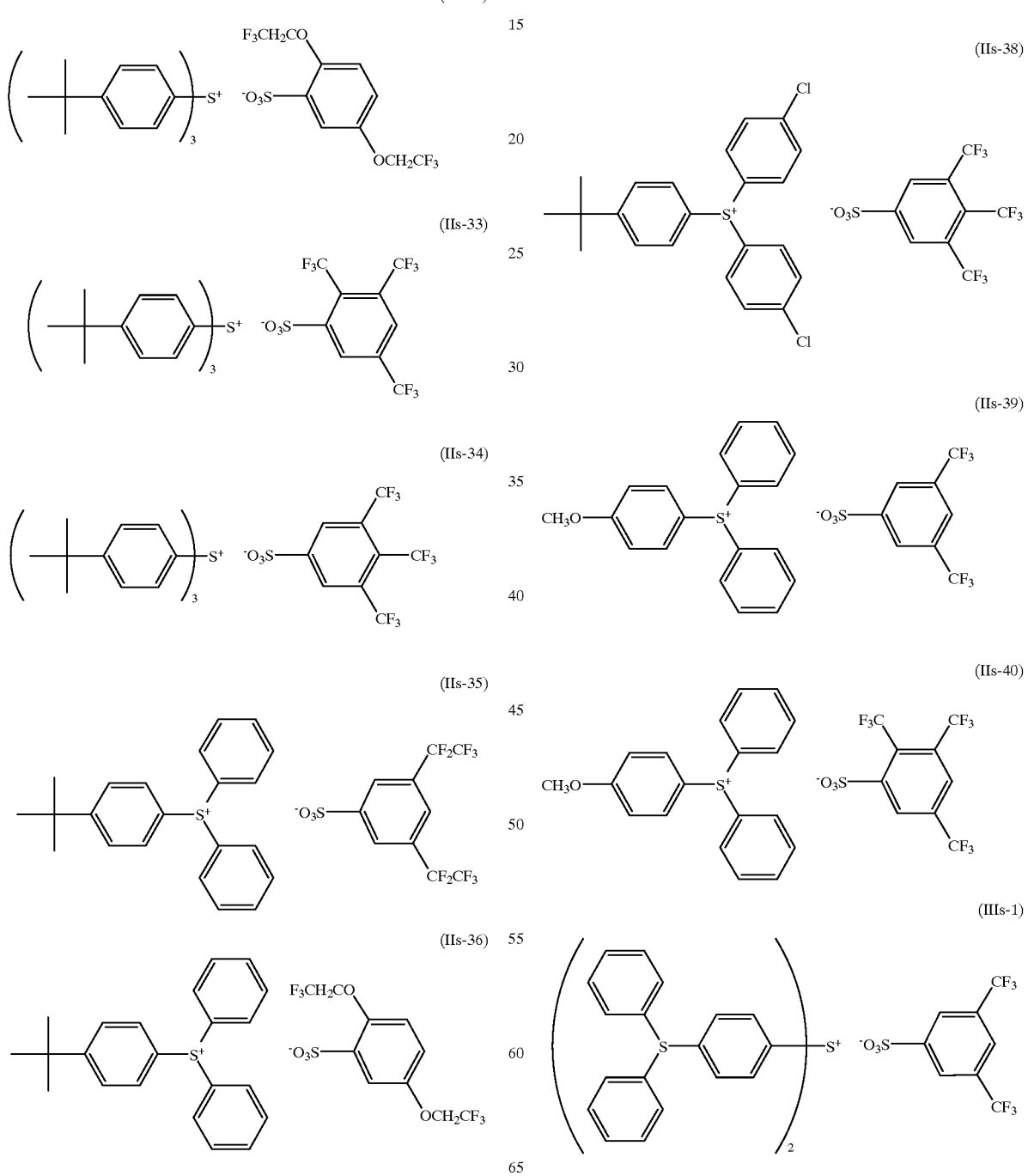

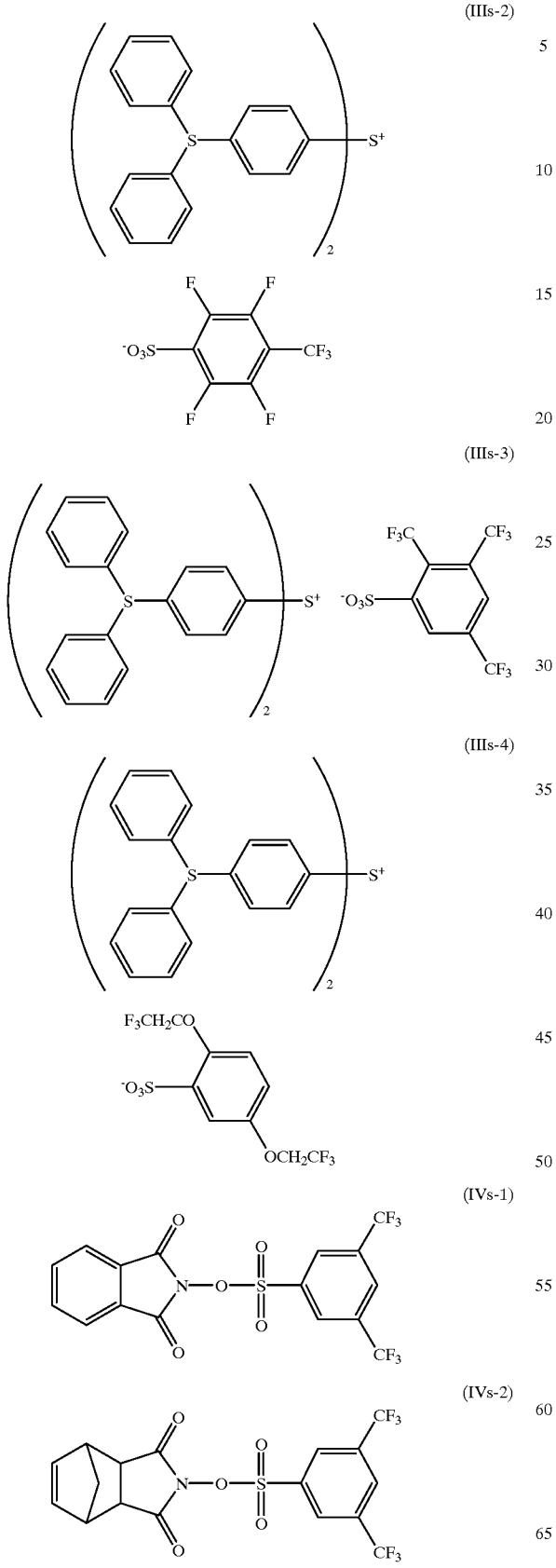
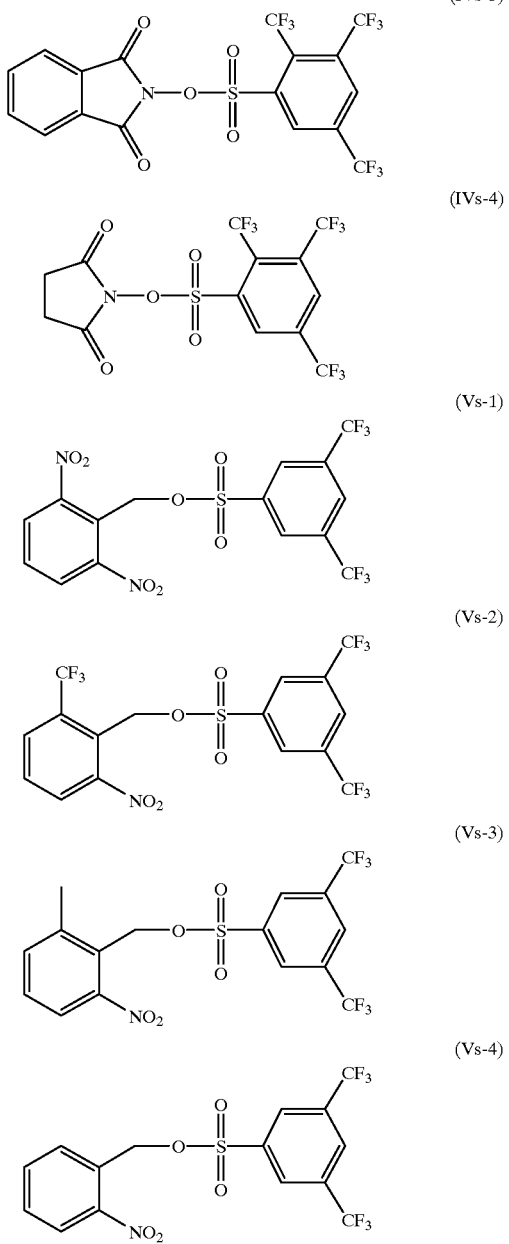

The compounds of component (B) may be used individually or in combination of two or more thereof.

The compound represented by formula (I) of component (B) can be synthesized by reacting an aromatic compound with a periodate and subjecting the resulting iodonium salt to salt exchange with a corresponding sulfonic acid.

The compound represented by formula (II) or (III) can be synthesized, for example, by a method comprising reacting an aryl Grignard reagent such as aryl magnesium bromide with a substituted or unsubstituted phenyl sulfoxide and subjecting the resulting triarylsulfonium halide to salt exchange with a corresponding sulfonic acid, a method comprising condensing a substituted or unsubstituted phenyl sulfoxide and a corresponding aromatic compound using an acid catalyst, e.g., methanesulfonic acid/diphosphorus pentaoxide or aluminum chloride and subjecting the resulting product to salt exchange, or a method comprising condensing a diaryliodonium salt and a diaryl sulfide using a catalyst, e.g., copper acetate and subjecting the resulting product to salt exchange.

The salt exchange can be conducted by a method wherein the halide salt formed is converted to a sulfonic acid salt using a silver reagent such as silver oxide or a method using an ion-exchange resin. The sulfonic acid or sulfonic acid salt for use in the salt exchange can be selected from commercially available compounds or can be obtained by a method of hydrolyzing a commercially available sulfonic acid halide.

The content of the compound of component (B) is preferably from 0.1 to 20% by weight, more preferably from 0.5 to 10% by weight, still more preferably from 1 to 7% by weight, based on the solid content of the positive resist composition of the present invention.

[2] (C) A photo-acid generator which may be used together with the compound of component (B) (Component (C)):

In the positive resist composition of the present invention, a photo-acid generator other than the compound of component (B) can be used together with the compound of component (B).

The photo-acid generator which is used together with the compound of component (B) can be appropriately selected from photoinitiators for photo-cation polymerization, photoinitiators for photo-radical polymerization, photo-achromatizing agents for dyes, photo-discoloring agents, and compounds which generate an acid by radiation conventionally used in a microresist or the like (an ultraviolet ray or far ultraviolet ray of from 200 to 400 nm, particularly preferably, a g-line, an h-line, an i-line or a KrF excimer laser beam), an ArF excimer laser beam, an electron beam, an X ray, a molecular beam or an ion beam. A mixture of these compounds can also be used.

Other examples of the photo-acid generator used together with the compound of component (B) include onium salts such as diazonium salts, ammonium salts, phosphonium salts, iodonium salts, sulfonium salts, selenonium salts or arsonium salts, organic halide compounds, organic metal/organic halide compounds, photo-acid generators having an o-nitrobenzyl-type protective group, compounds which photolyze to generate a sulfonic acid, represented by iminosulfonate and the like, disulfone compounds, diazoketosulfone compounds and diazodisulfone compounds.

Also, polymer compounds having the group or compound generating an acid by irradiation introduced into the main or side chain thereof may be used.

Further, compounds which generate an acid by irradiation as described in V. N. R. Pillai, *Synthesis*, (1), 1 (1980), A. Abad et al., *Tetrahedron Lett.*, (47) 4555 (1971), D. H. R. Barton et al., *J. Chem. Soc.*, (C), 329 (1970), U.S. Pat. No. 3,779,778 and European Patent 126,712 may be used.

Among the above-described compounds which decompose upon irradiation with an actinic ray or radiation to generate an acid, those which can be effectively used include compounds represented by formula (PAG3), (PAG4), (PAG6) or (PAG7) described below.

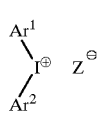
(PAG3)

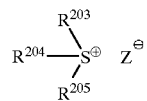
(PAG4)

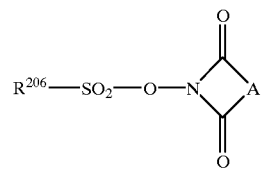
(PAG6)

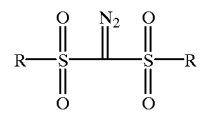
(PAG7)

In formulae (PAG3) and (PAG4), $Ar^1$ and $Ar^2$ which may be the same or different, each represents a substituted or unsubstituted aryl group. Preferred examples of the substituent include an alkyl group, a haloalkyl group, a cycloalkly group, an aryl group, an alkoxy group, a nitro group, a carboxyl group, an alkoxycarbonyl group, a hydroxy group and a halogen atom.

$R^{203}$, $R^{204}$ and $R^{205}$, which may be the same or different, each represents a substituted or unsubstituted alkyl group or a substituted or unsubstituted aryl group, preferably an aryl group having from 6 to 14 carbon atoms, an alkyl group having from 1 to 8 carbon atoms, or a substituted derivative thereof. Preferred examples of the substituent include, for the aryl group, an alkoxy group having from 1 to 8 carbon atoms, an alkyl group having from 1 to 8 carbon atoms, a nitro group, a carboxyl group, a hydroxyl group and a halogen atom, and for the alkyl group, an alkoxy group having from 1 to 8 carbon atoms, a carboxyl group and an alkoxycarbonyl group.

$Z^-$ represents a counter anion. Examples of the counter anion include $BF_4^-$, $AsF_6^-$, $PF_6^-$, $SbF_6^-$, $SiF_6^{2-}$, $ClO_4^-$, a substituted or unsubstituted alkanesulfonate anion, a perfluoroalkanesulfonate anion, a substituted or unsubstituted benzene sulfonate anion, a substituted or unsubstituted naphthalenesulfonate anion, a substituted or unsubstituted anthracene sulfonate anion and a substituted or unsubstituted camphorsulfonate anion, however, the present invention should not be construed as being limited thereto. Preferred examples of the counter anion include an alkanesulfonate anion, a perfluoroalkanesulfonate anion, an alkyl-substituted benzenesulfonate anion and pentafluorobenzenesulfonate anion.

Alternatively, two of $R^{203}$, $R^{204}$ and $R^{205}$ or $Ar^1$ and $Ar^2$ may be combined through a single bond or a substituent.

In formulae (PAG6) and (PAG7), $R^{206}$ represents a substituted or unsubstituted alkyl group or a substituted or unsubstituted aryl group, A represents a substituted or unsubstituted alkylene group, a substituted or unsubstituted alkenylene group or a substituted or unsubstituted arylene group, and R represents a straight-chain, branched or cyclic alkyl group or an aryl group which may be substituted.

Specific examples of the photo-acid generator used together with the compound of component (B) include the following compounds, however, the present invention should not be construed as being limited thereto.

(PAG3-1)
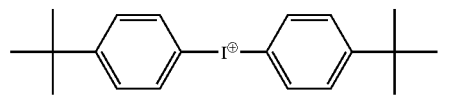

(PAG3-2)
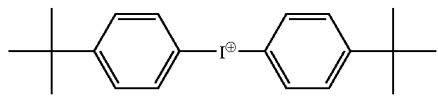

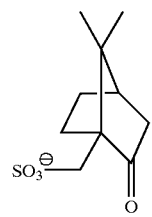

(PAG3-3)
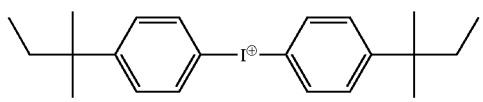

(PAG4-1)
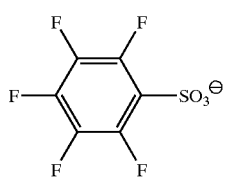

(PAG4-2)
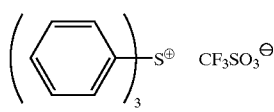

(PAG4-3)
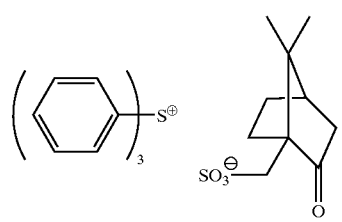

(PAG4-4)
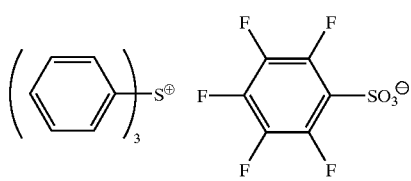

(PAG4-5)
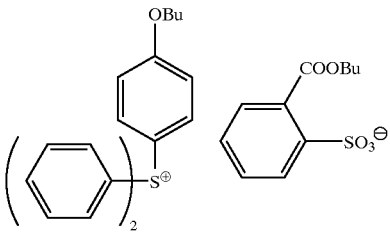

(PAG6-1)
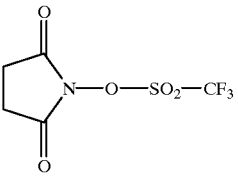

(PAG6-2)
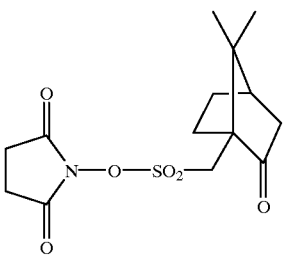

(PAG6-3)
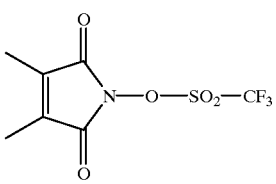

(PAG7-1)
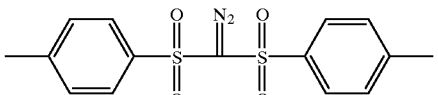

(PAG7-2)
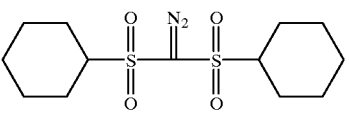

(PAG7-3)
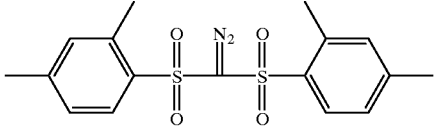

Among the photo-acid generators used together with the compound of component (B), (C1) a compound which generates a sulfonic acid upon irradiation with an actinic ray or radiation and which is other than the compound of component (B) is preferred in view of attaining improved sensitivity and resolution.

Examples of the compound of component (C1) include, in addition to those described above, a compound represented by formula (I), (II) or (III) described above in which $X^-$ represents an anion of an aromatic sulfonic acid which is not substituted with a fluorine atom-containing group. Specific examples thereof include compounds of the specific examples of component (B) in which the fluorine atoms in the anion portions are substituted with hydrogen atoms.

The positive resist composition of the present invention may contain a compound which generates a carboxylic acid upon irradiation with an actinic ray or radiation as component (C). By the use of such a compound, pitch dependency is improved.

Examples of such a compound of component (C) include (C2) a compound represented by formula (I), (II) or (III) described above in which $X^-$ represents an anion of a saturated aliphatic carboxylic acid or aromatic carboxylic acid, which is substituted with a fluorine atom, and (C3) a compound represented by formula (I), (II) or (III) described above in which $X^-$ represents an anion of a saturated aliphatic carboxylic acid or aromatic carboxylic acid, which is not substituted with a fluorine atom.

Specific examples of the compound of component (C2) represented by formula (I) or (III) described above in which $X^-$ represents an anion of a saturated aliphatic carboxylic acid or aromatic carboxylic acid, which is substituted with a fluorine atom, are described below, however, the present invention should not be construed as being limited thereto.

(I-1)
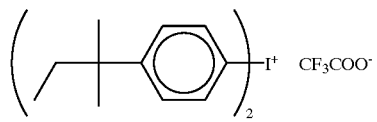

(I-2)
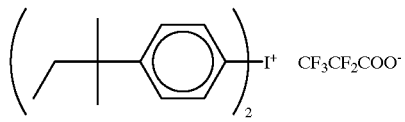

(I-3)
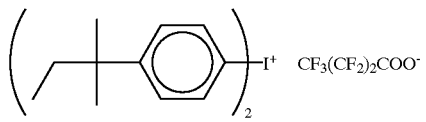

(I-4)
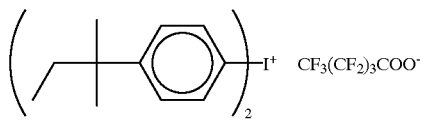

(I-5)
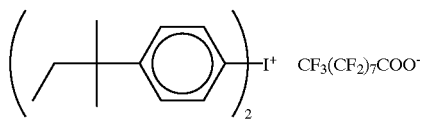

(I-6)
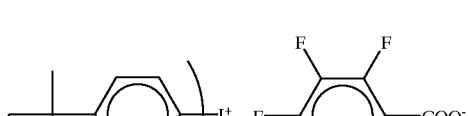

(I-7)
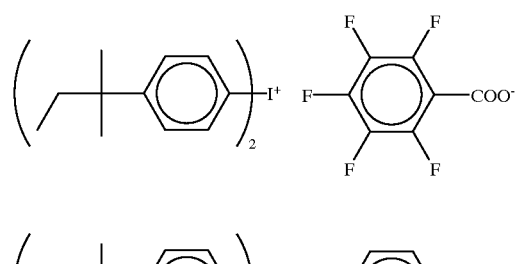

(I-8)
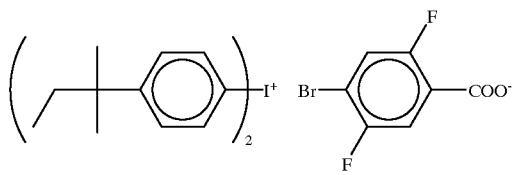

(I-9)
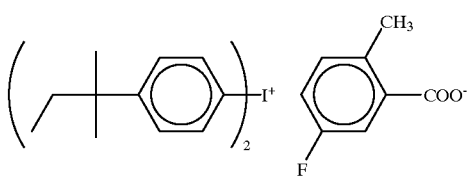

(I-10)
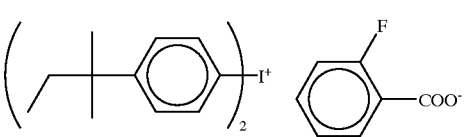

(I-11)
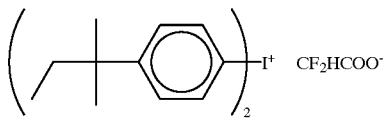

(I-12)
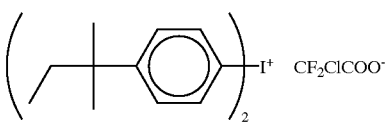

(I-13)
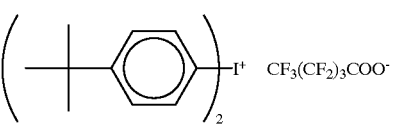

(I-14)
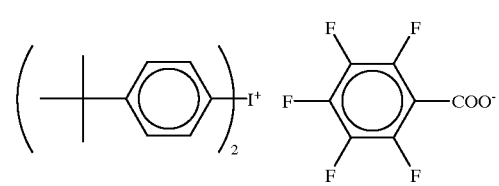

(I-15)
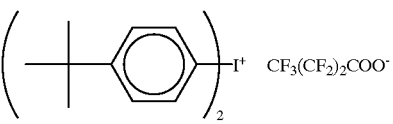

(I-16)
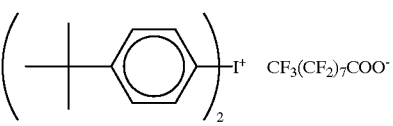

(I-17)

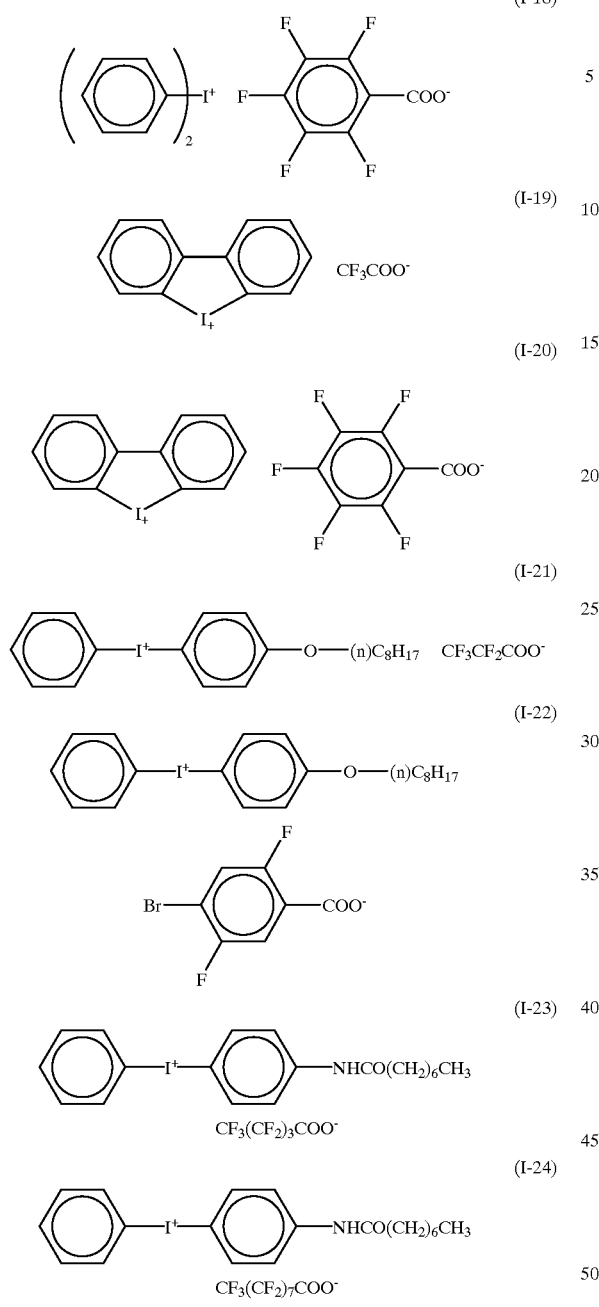
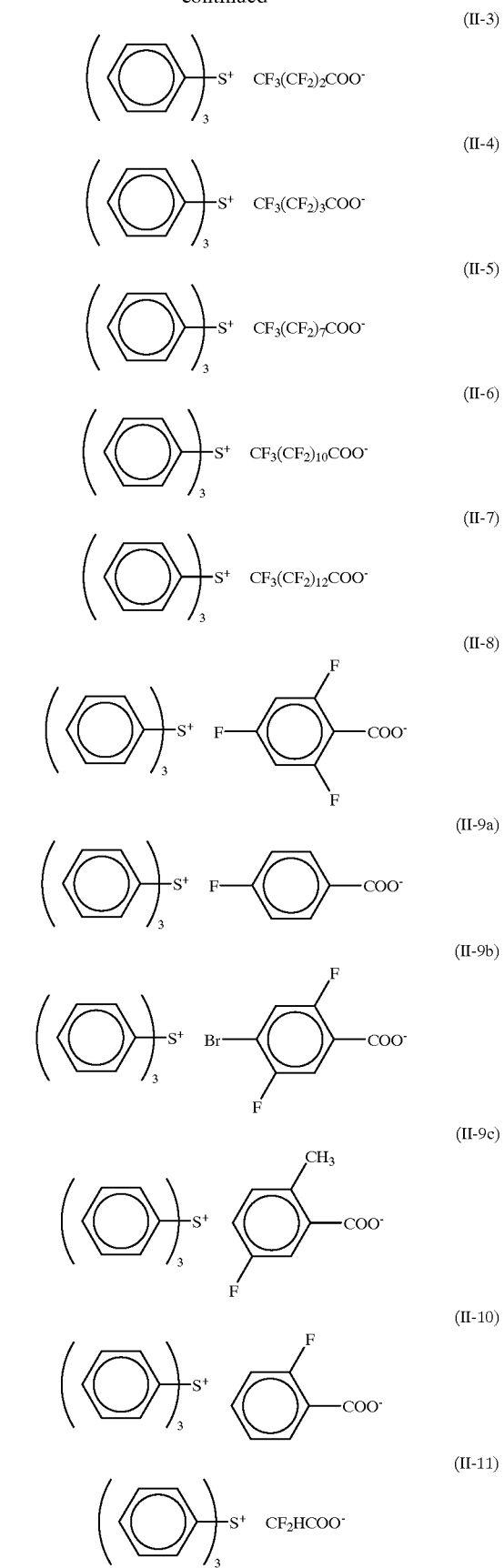
Specific examples (II-1) to (II-48) of the photo-acid generator represented by formula (II):
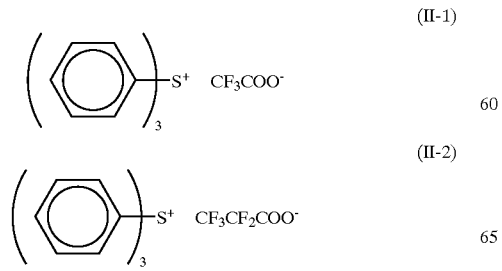

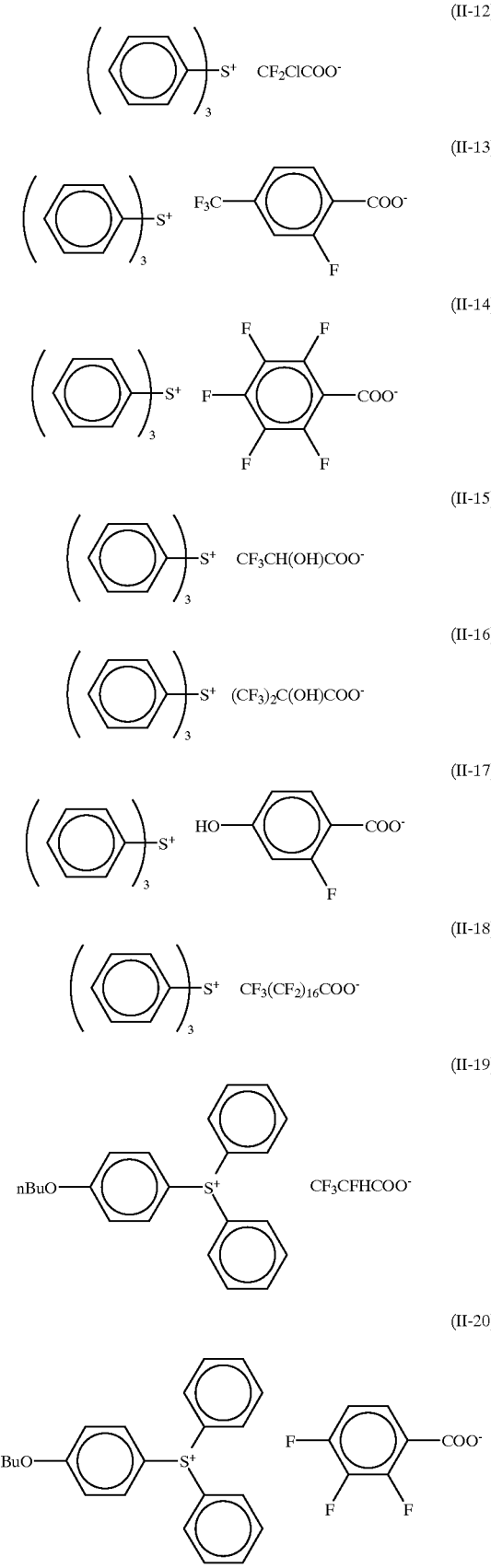
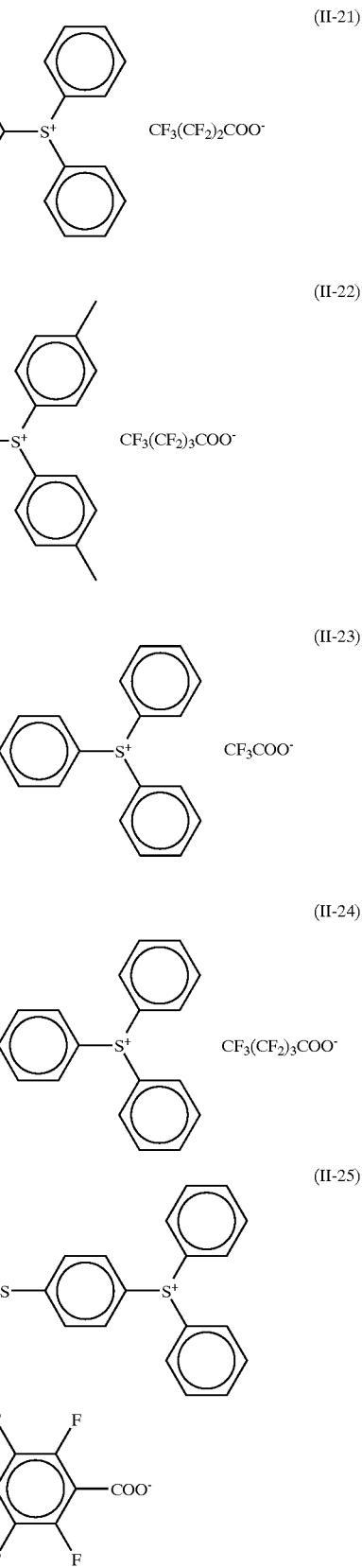

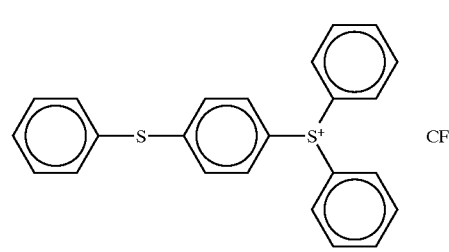 (II-26)
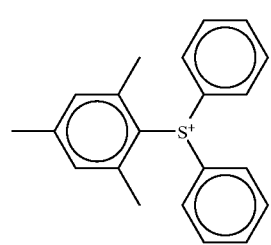 (II-27)
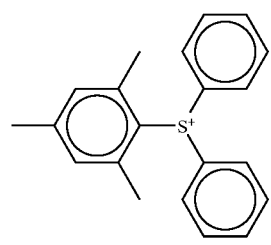 (II-28)
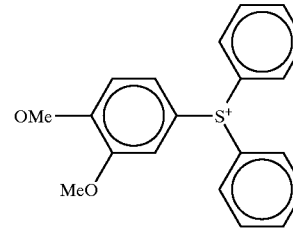 (II-29)
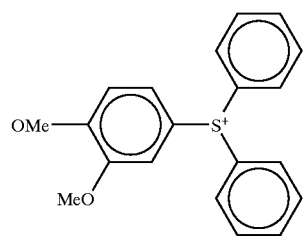 (II-30)
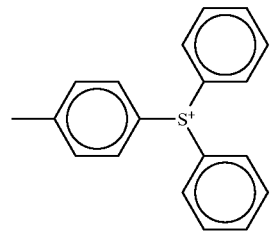 (II-31)
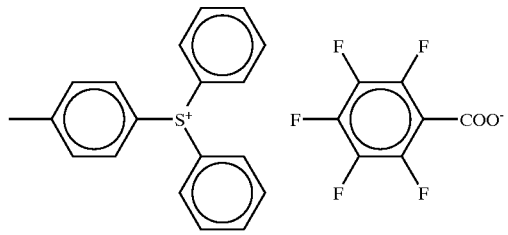 (II-32)
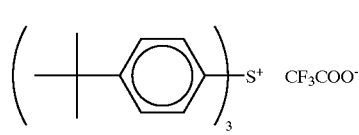 (II-33)
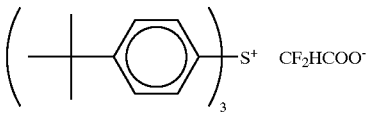 (II-34)
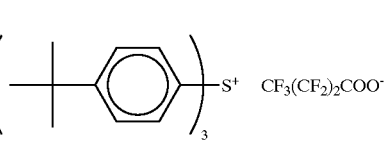 (II-35)
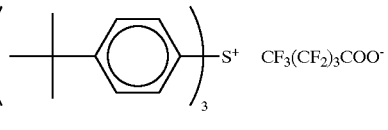 (II-36)
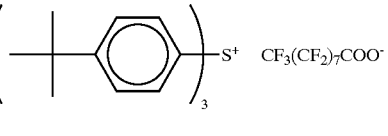 (II-37)
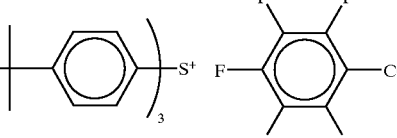 (II-38)
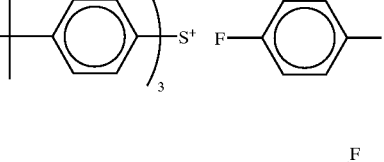 (II-39)
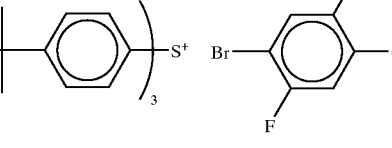 (II-40)

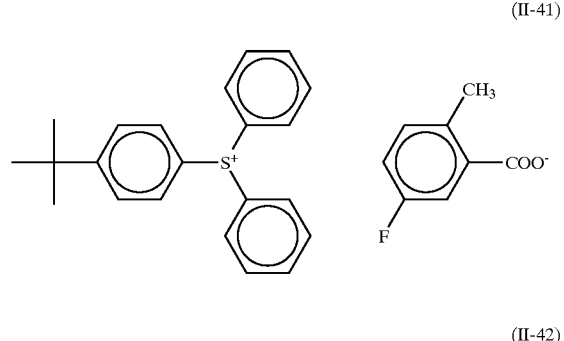
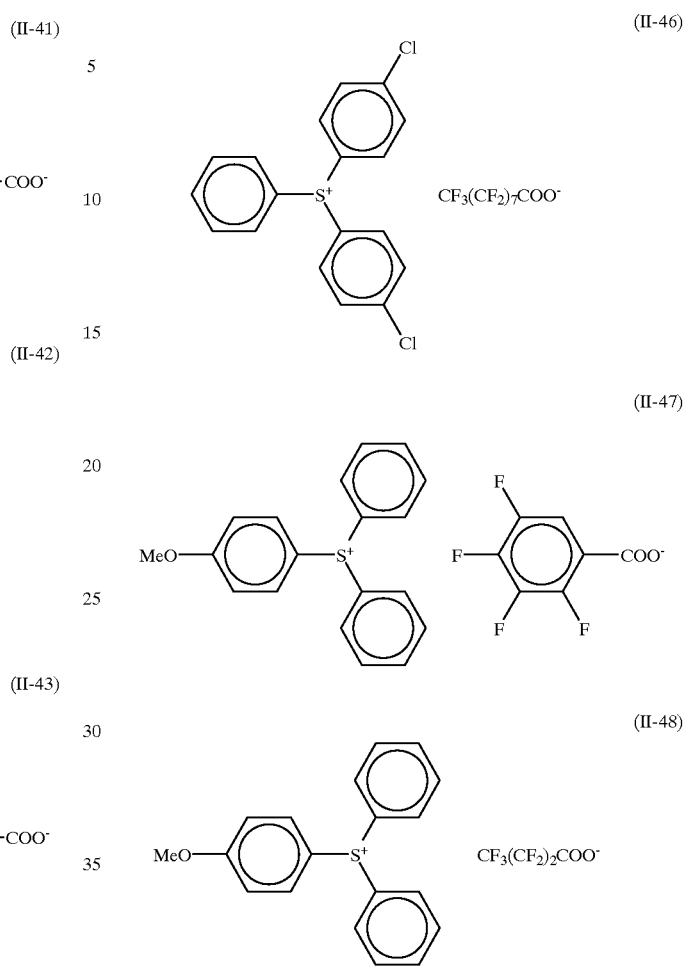
Specific examples (III-1) to (III-4) of the photo-acid generator represented by formula (III):
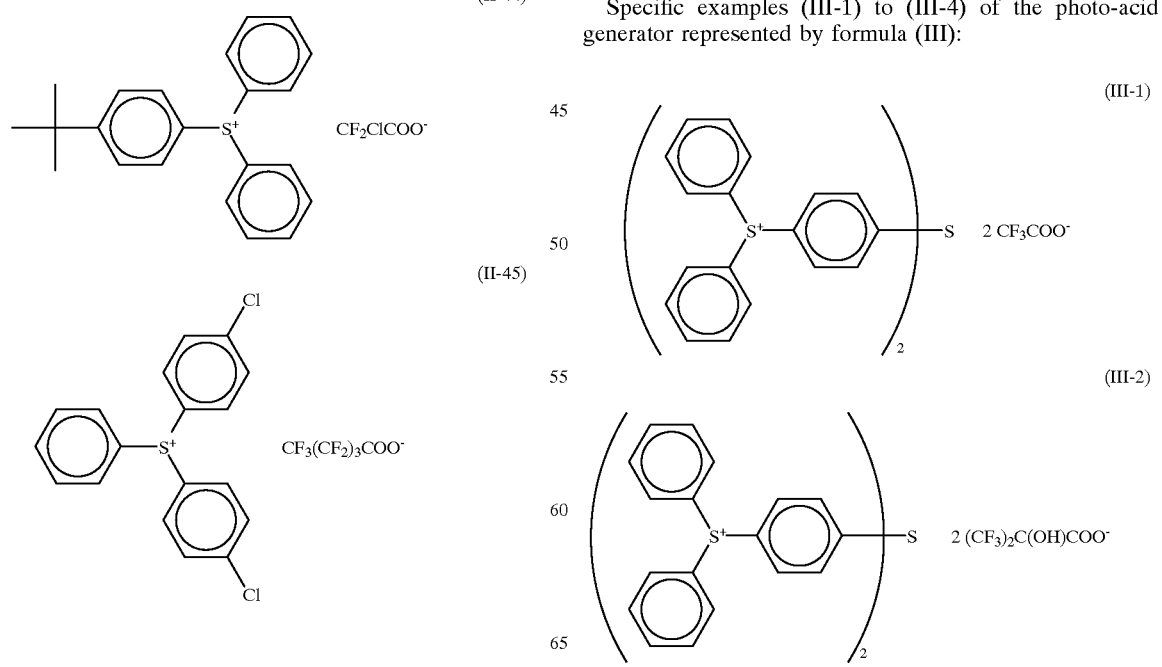

(III-3)

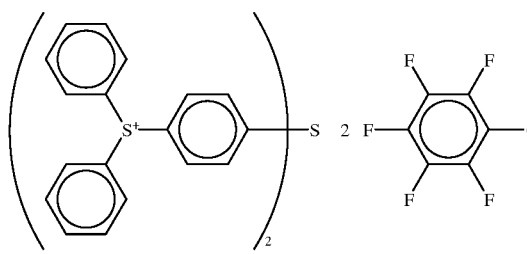

(III-4)

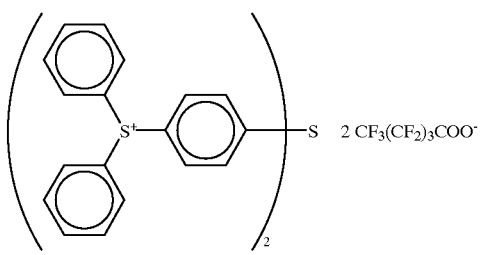

Specific examples (VI-1) to (V-4) of other photo-acid generators:

(IV-1)

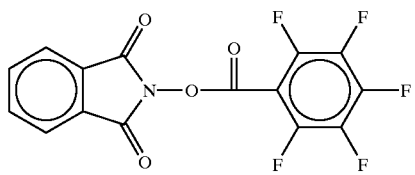

(IV-2)

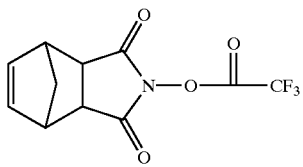

(IV-3)

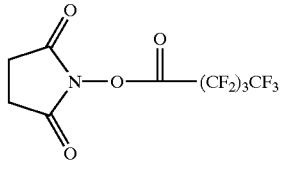

(V-1)

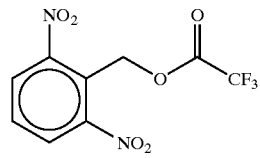

(V-2)

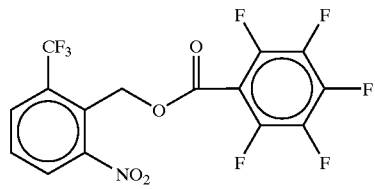

(V-3)

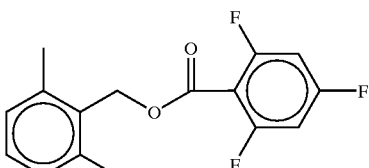

(V-4)

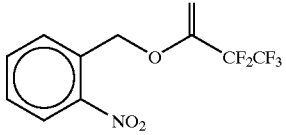

The photo-acid generator used together with the compound of component (B) in the resist composition of the present invention is preferably selected from the compounds represented by formulae (PAG3), (PAG4) and (PAG7) and the compounds of components (C1), (C2) and (C3) described above.

The compound of component (C) may be used in a range of not more than 5% by weight, preferably not more than 4% by weight, based on the solid content of the positive resist composition of the present invention.

A weight ratio of the photo-acid generator of component (B) to the photo-acid generator of component (C) is from 100/0 to 5/95, preferably from 95/5 to 10/90.

[3] (A) a resin capable of decomposing by the action of an acid to increase solubility in an alkali developer (Component (A)):

The resin of component (A) is the indispensable component in the first composition of the present invention. The resin of component (A) having a group which decomposes with an acid and increases solubility in an alkali developer (hereinafter also referred to as an "acid-decomposable group" sometimes) is a resin having introduced an acid-decomposable group into the polymer main chain or side chain, or both the polymer main chain and side chain. A resin having an acid-decomposable group in the side chain thereof is more preferred.

Preferred examples of the group decomposable with an acid include a group represented by —COOA$^0$ and a group represented by —O—B$^0$. Examples of group containing such a group include a group represented by —R$^0$—COOA$^0$ and a group represented by —Ar—O—B$^0$.

In the above formulae, A$^0$ represents —C(R$^{01}$) (R$^{02}$) (R$^{03}$), —Si(R$^{01}$) (R$^{02}$) (R$^{03}$) or —C(R$^{04}$) (R$^{05}$)—O—R$^{06}$, and B$^0$ represents —A$^0$ or —CO—O—A$^0$ (wherein R$^0$, R$^{01}$, R$^{02}$, R$^{03}$, R$^{04}$, R$^{05}$, R$^{06}$ and Ar each has the same meaning as defined hereinafter).

Preferred examples of the acid-decomposable group include a silyl ether group, a cumyl ester group, an acetal group, a tetrahydropyranyl ether group, an enol ether group, an enol ester group, a tertiary alkyl ether group, a tertiary alkyl ester group and a tertiary alkylcarbonate group. More preferred examples thereof include a tertiary alkyl ester group, a tertiary alkylcarbonate group, a cumyl ester group, an acetal group and a tetrahydropyranyl ether group. An acetal group is particularly preferred.

A parent resin in the case wherein the acid-decomposable groups are bonded as a side chain is an alkali-soluble resin having an —OH group or a —COOH group, preferably an —R$^0$—COOH group or an —Ar—OH group, in the side chain. For instance, the alkali-soluble resins described below can be exemplified as such parent resins.

An alkali-dissolution rate of the alkali-soluble resin is preferably not less than 170 angstrom/sec, more preferably not less than 330 angstrom/sec, when measured in a 0.261 N tetramethylammonium hydroxide (TMAH) solution at 23° C.

In view of attaining a rectangular profile, an alkali-soluble resin which highly transmits a far ultraviolet ray or an excimer laser beam is preferred. Specifically, an alkali-soluble resin whose 1 μm-thick film has transmittance at 248 nm of from 20% to 90% is preferred.

Especially preferred examples of the alkali-soluble resin from such a standpoint include poly (o-, m-, or p-hydroxystyrene) or copolymer thereof, hydrogenated poly (hydroxystyrene), halogen- or alkyl-substituted poly (hydroxystyrene), partially O-alkylated or O-acylated poly (hydroxystyrene), styrene/hydroxystyrene copolymer, α-methylstyrene/hydroxystyrene copolymer and hydrogenated novolak resin.

The resin having the acid-decomposable group for use in the present invention can be obtained by reacting an alkali-soluble resin with a precursor of the acid-decomposable group or by copolymerizing a monomer for forming an alkali-soluble resin, which has the acid-decomposable group with any of various monomers, as described, for example, in European Patent 254,853, JP-A-2-25850, JP-A-3-223860 and JP-A-4-251259.

Specific examples of the resin having the acid-decomposable group for use in the present invention are set forth below, but the present invention should not be construed as being limited thereto.

p-tert-Butoxystyrene/p-hydroxystyrene copolymer
p-(tert-Butoxycarbonyloxy)styrene/p-hydroxystyrene copolymer
p-(tert-Butoxycarbonylmethyloxy)styrene/p-hydroxystyrene copolymer
4-(tert-Butoxycarbonylmethyloxy)-3-methylstyrene/4-hydroxy-3-methylstyrene copolymer
p-(tert-Butoxycarbonylmethyloxy)styrene/p-hydroxystyrene (10% hydrogenated) copolymer
m-(tert-Butoxycarbonylmethyloxy)styrene/m-hydroxystyrene copolymer
o-(tert-Butoxycarbonylmethyloxy)styrene/o-hydroxystyrene copolymer
p-(Cumyloxycarbonylmethyloxy)styrene/p-hydroxystyrene copolymer
Cumyl methacrylate/methyl methacrylate copolymer 4-tert-Butoxycarbonylstyrene/dimethyl maleate copolymer
Benzyl methacrylate/tetrahydropyranyl methacrylate copolymer
p-(tert-Butoxycarbonylmethyloxy)styrene/p-hydroxystyrene/styrene copolymer
p-tert-Butoxystyrene/p-hydroxystyrene/fumaronitrile copolymer
tert-Butoxystyrene/hydroxyethyl methacrylate copolymer
Styrene/N-(4-hydroxyphenyl)maleimide/N-(4-tert-butoxycarbonyloxyphenyl)maleimide copolymer
p-Hydroxystyrene/tert-butyl methacrylate copolymer
Styrene/p-hydroxystyrene/tert-butyl methacrylate copolymer
p-Hydroxystyrene/tert-butyl acrylate copolymer
Styrene/p-hydroxystyrene/tert-butyl acrylate copolymer
p-(tert-Butoxycarbonylmethyloxy)styrene/p-hydroxystyrene/N-methylmaleimide copolymer
tert-Butyl methacrylate/1-adamantylmethyl methacrylate copolymer
p-Hydroxystyrene/tert-butyl acrylate/p-acetoxystyrene copolymer
p-Hydroxystyrene/tert-butyl acrylate/p-(tert-butoxycarbonyloxy) styrene copolymer
p-Hydroxystyrene/tert-butyl acrylate/p-(tert-butoxycarbonylmethyloxy) styrene copolymer Of the resins of component (A) having the acid-decomposable group, resins containing a repeating unit represented by formula (IV) and a repeating unit represented by formula (V) described above are preferred. The resulting resist composition has high resolution and change in its performance with the lapse of time from exposure to baking is further restrained.

In formula (IV) described above, L represents a hydrogen atom, a straight-chain, branched or cyclic alkyl group which may be substituted or an aralkyl group which may be substituted; Z represents a straight-chain, branched or cyclic alkyl group which may be substituted or an aralkyl group which may be substituted; or Z and L may be combined with each other to form a 5-membered or 6-membered ring.

The straight-chain, branched or cyclic alkyl group for L or Z in formula (IV) includes that having from 1 to 20 carbon atoms, for example, methyl ethyl, propyl, isopropyl, n-butyl, isobutyl, tert-butyl, pentyl, cyclopentyl, hexyl, cyclohexyl, octyl and dodecyl.

Preferred examples of the substituent for the alkyl group represented by L or Z include an alkyl group, an alkoxy group, a hydroxy group, a halogen atom, a nitro group, an acyl group, an acyloxy group, an acylamino group, a sulfonylamino group, an alkylthio group, an arylthio group, an aralkylthio group, a thiophenecarbonyloxy group, thiophenemethylcarbonyloxy group and a heterocyclic residue such as a pyrrolidone residue. The substituent having not more than 12 carbon atoms is preferred.

Specific examples of the substituted alkyl group include cyclohexylethyl, alkylcarbonyloxymethyl, alkylcarbonyloxyethyl, arylcarbonyloxyethyl, aralkylcarbonyloxyethyl, alkyloxymethyl, aryloxymethyl, aralkyloxymethyl, alkyloxyethyl, aryloxyethyl, aralkyloxyethyl, alkylthiomethyl, arylthiomethyl, aralkylthiomethyl, alkylthioethyl, arylthioethyl and aralkylthioethyl.

The alkyl groups contained in these groups are not particularly limited and include any of straight-chain, branched and cyclic alkyl groups. The alkyl groups may be substituted with one or more of the substituents described for the alkyl group or alkoxy group above. Examples of the alkylcarbonyloxyethyl group include cyclohexylcarbonyloxyethyl, tert-butylcyclohexylcarbonyloxyethyl and n-butyl cyclohexyl-carbonyloxyethyl. The aryl groups contained in the above-described groups are also not particularly limited and include those having from 6 to 14 carbon atoms, for example, phenyl, xylyl, tolyl, cumenyl, naphthyl and anthryl. The aryl groups may be substituted with one or more of the substituents described for the alkyl group or alkoxy group above. Examples of the aryloxyethyl group include phenyloxyethyl and cyclohexylphenyloxyethyl. The aralkyl groups contained in theses groups are also not particularly limited and include, for example, benzyl. Examples of the aralkylcarbonyloxyethyl group include benzylcarbonyloxyethyl.

The aralkyl group for L or Z in formula (IV) includes that having from 7 to 15 carbon atoms, for example, a substituted or unsubstituted benzyl group and a substituted or unsubstituted phenethyl group. Preferred examples of the substituent for the aralkyl group include an alkoxy group, a hydroxy group, a halogen atom, a nitro group, an acyl group, an acylamino group, a sulfonylamino group, an alkylthio group, an arylthio group and aralkylthio group. Specific examples of the substituted aralkyl group include alkoxybenzyl, hydroxybenzyl and phenylthiophenetyl. A number of carbon atoms contained in the substituent on the aralkyl group represented by L or Z is preferably not more than 12.

It is preferred to introduce a bulky group such as phenyl or cyclohexyl into the terminal of the substituted alkyl group or substituted aralkyl group, since further improvement in edge roughness is recognized.

The 5-membered or 6-membered ring formed by being combined with Z and L each other includes, for example, a tetrahydropyran ring and a tetrahydrofuran ring.

A molar ratio of the repeating unit represented by formula (IV)/the repeating unit represented by formula (V) present in the resin is preferably from 1/99 to 60/40, more preferably from 5/95 to 50/50 and still more preferably from 10/90 to 40/60.

The resin containing the repeating unit represented by formula (IV) and the repeating unit represented by formula (V) described above may further contain a repeating unit derived from other monomer(s).

Examples of the other monomer include a hydrogenated hydroxystyrene; a halogen-, alkoxy- or alkyl-substituted hydroxystyrene; styrene; a halogen-, alkoxy- acyloxy- or alkyl-substituted styrene; maleic anhydride; an acrylic acid derivative; a methacrylic acid derivative; and an N-substituted maleimide, but the present invention should not be construed as being limited thereto.

A molar ratio of the repeating unit represented by formula (IV) and the repeating unit represented by formula (V)/the repeating unit of other monomer, i.e., [(IV)+(V)]/[other monomer]present in the resin is ordinarily from 100/0 to 50/50, preferably from 100/0 to 60/40 and more preferably from 100/0 to 70/30.

Of the resins containing the repeating unit represented by formula (IV) and the repeating unit represented by formula (V), those wherein Z in formula (IV) is a substituted alkyl group or a substituted aralkyl group are preferred.

It is particularly preferred that the resin of component (A) is a mixture of two or more of the resins containing the repeating unit represented by formula (IV) and the repeating unit represented by formula (V), one of which is the resin wherein Z in formula (IV) is a substituted alkyl group or a substituted aralkyl group and the other of which is a resin wherein Z in formula (IV) is an alkyl group. A weight ratio of the former to the latter is preferably from 10/90 to 90/10.

Specific examples of the resin containing the repeating unit represented by formula (IV) and the repeating unit represented by formula (V) and other resins which can be used in the present invention are set forth below, bur the present invention should not be construed as being limited thereto.

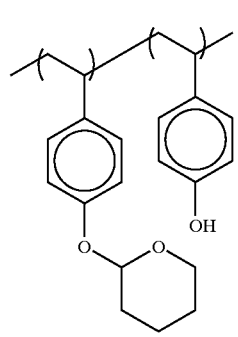 (A-1)

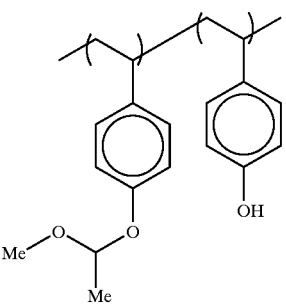 (A-2)

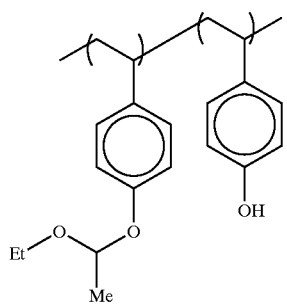 (A-3)

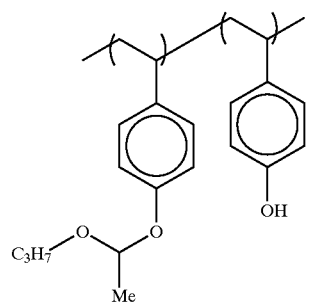 (A-4)

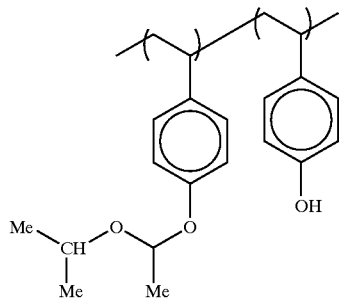 (A-5)

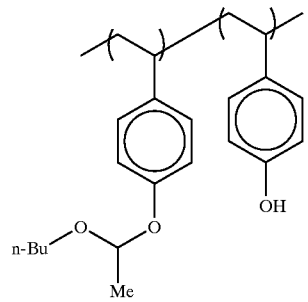 (A-6)

-continued
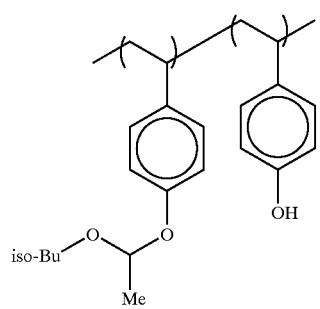
(A-7)
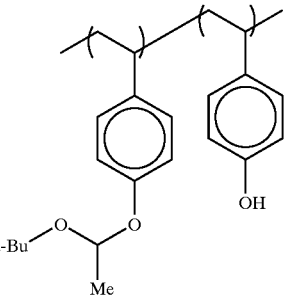
(A-8)
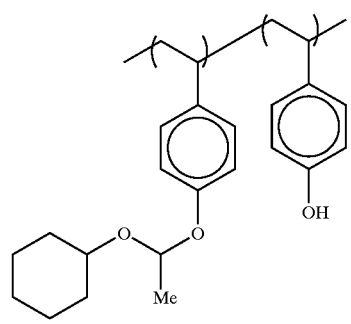
(A-9)
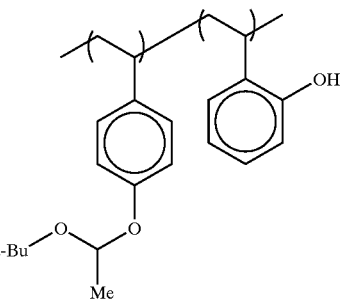
(A-10)
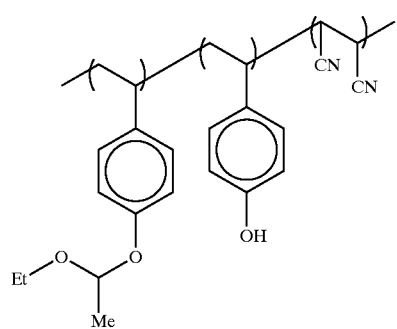
(A-11)
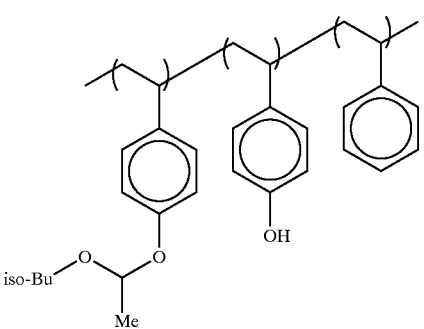
(A-12)
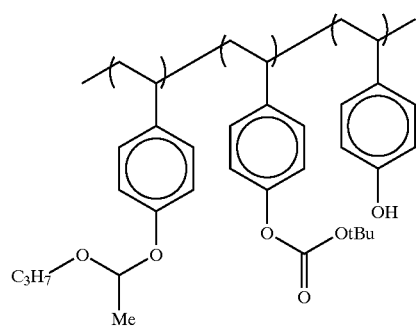
(A-13)
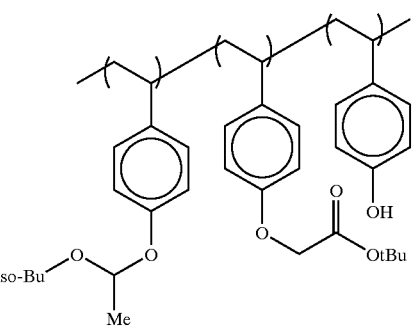
(A-14)

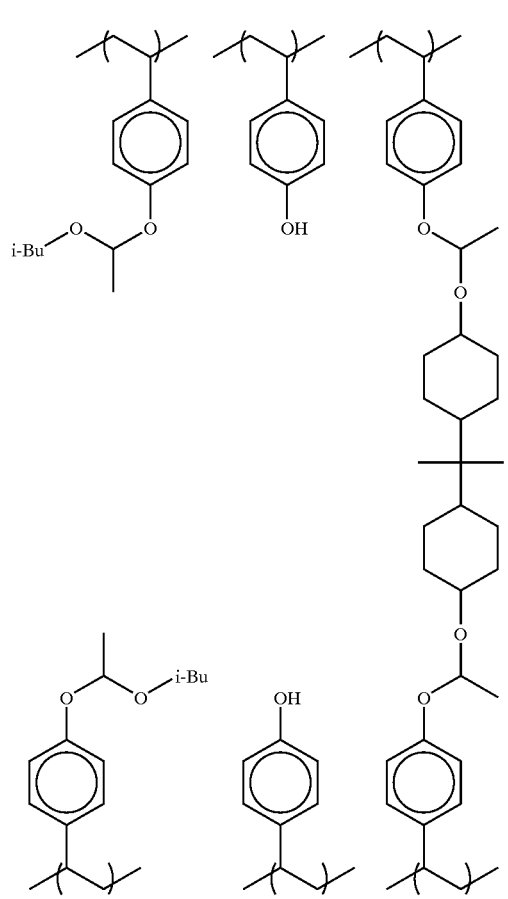
(A-15)
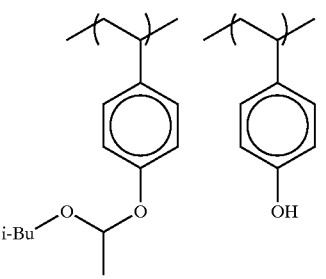
(A-16)
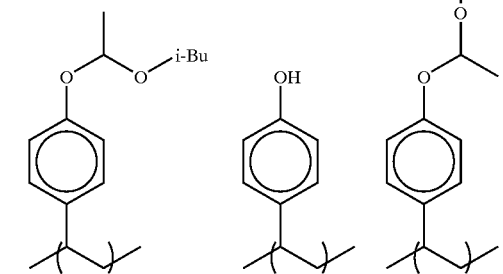
(A-17)
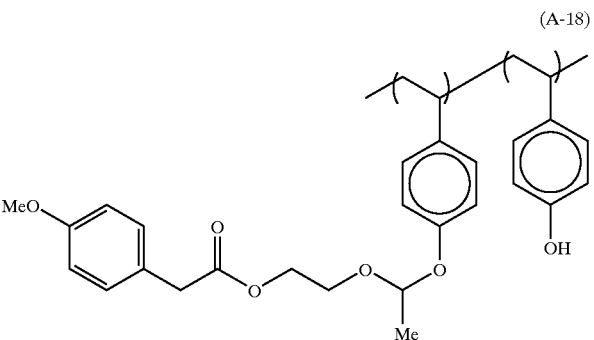
(A-18)
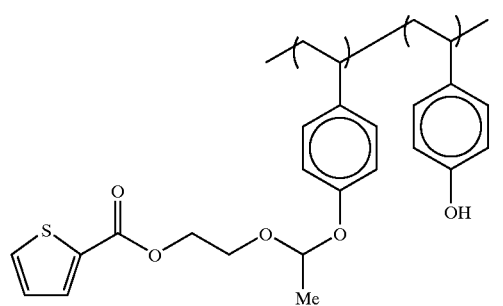
(A-19)
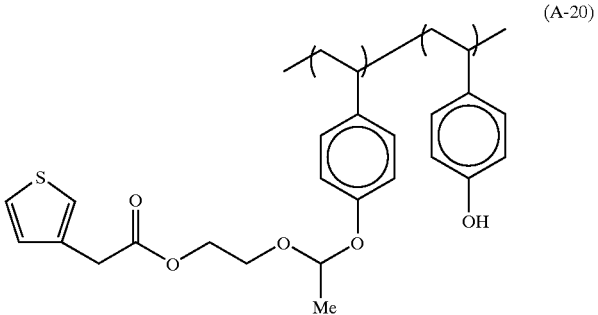
(A-20)

-continued
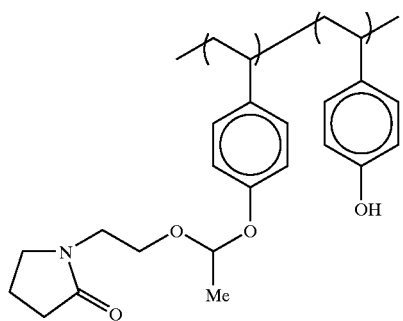
(A-21)
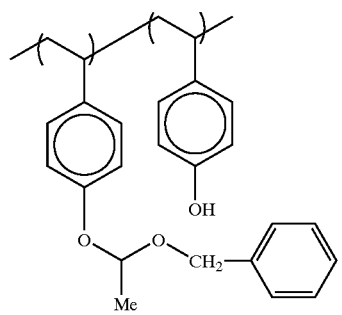
(A-22)
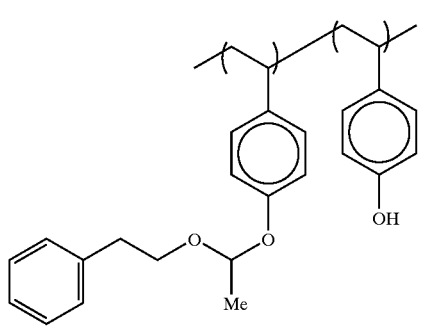
(A-23)
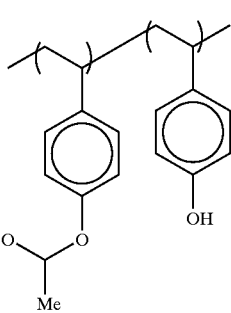
(A-24)
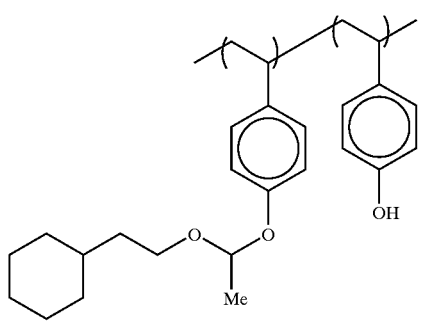
(A-25)
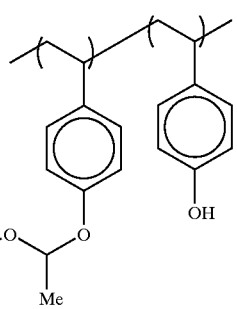
(A-26)
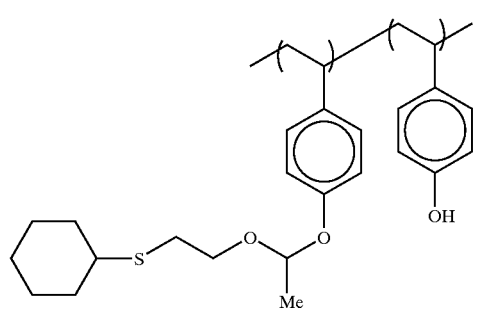
(A-27)
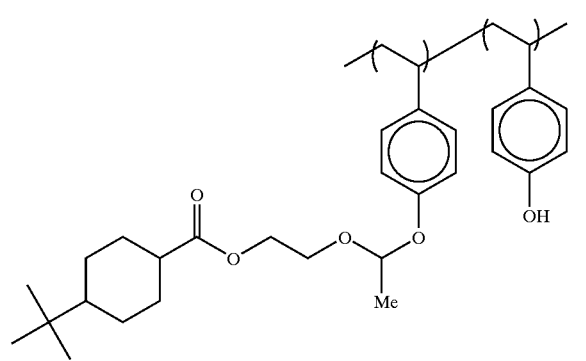
(A-28)

(A-29)
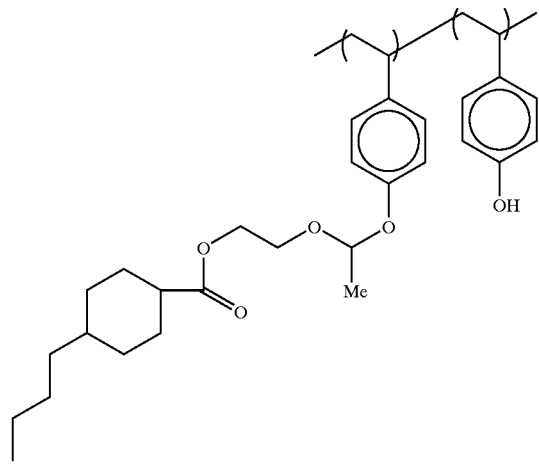
(A-30)
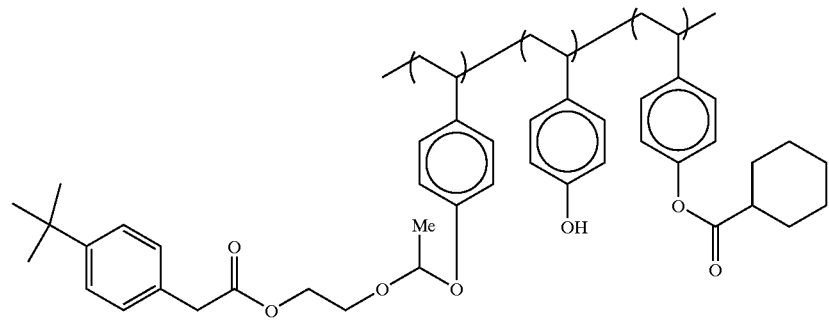
(A-31)
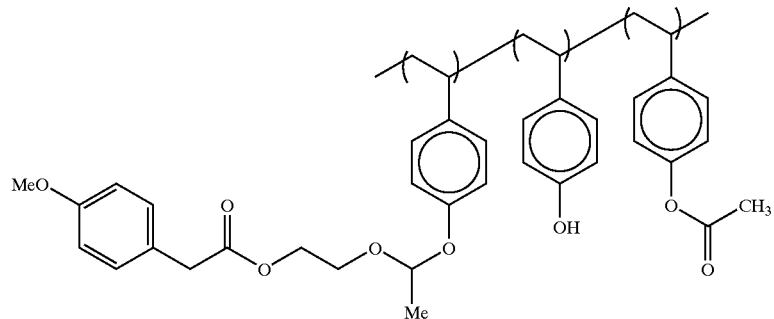
(A-32)
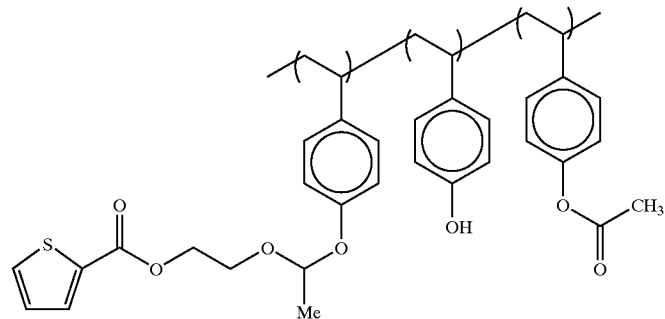

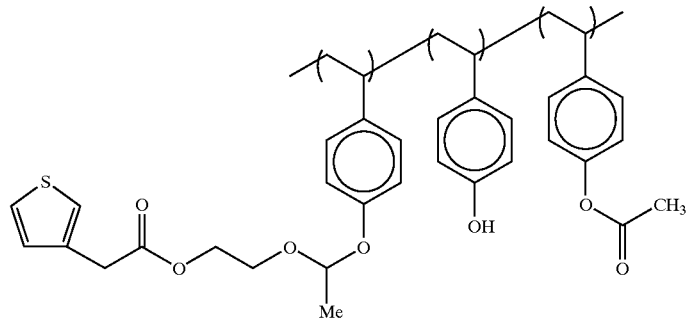
(A-33)
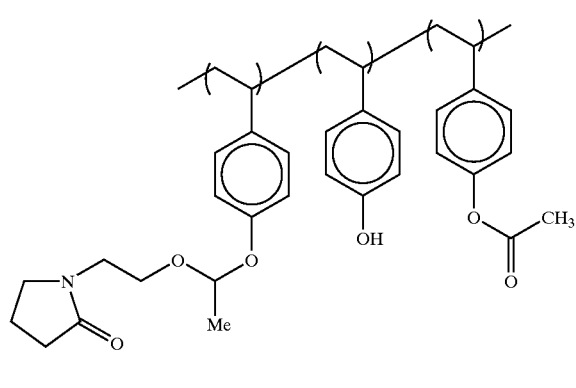
(A-34)
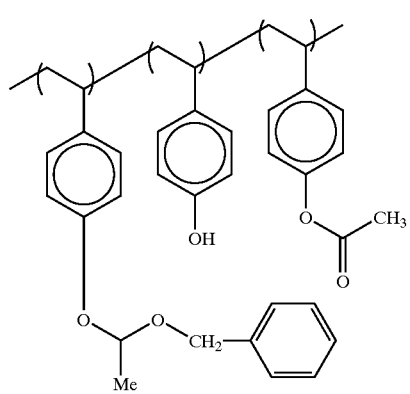
(A-35)
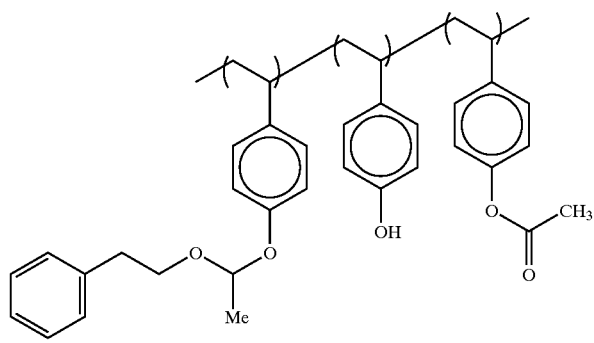
(A-36)
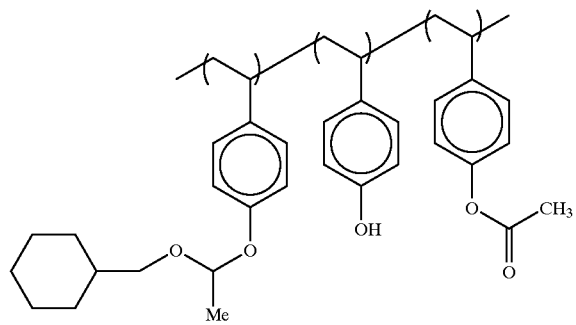
(A-37)

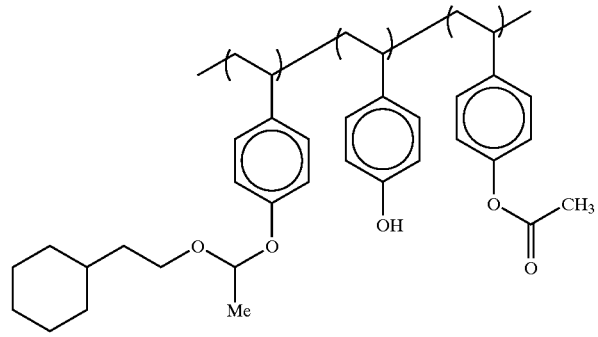
(A-38)
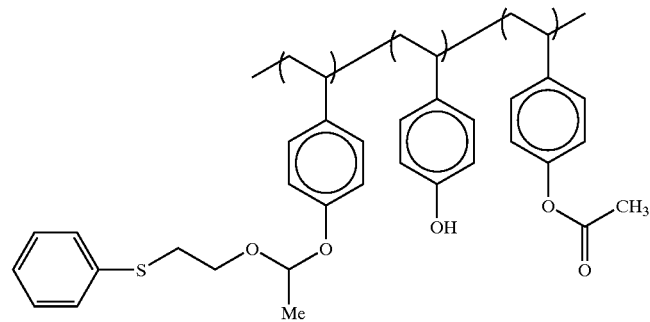
(A-39)
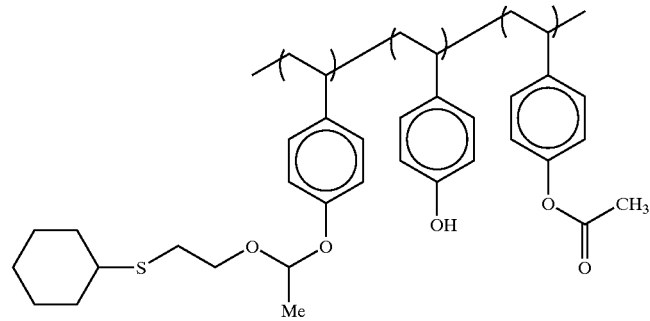
(A-40)
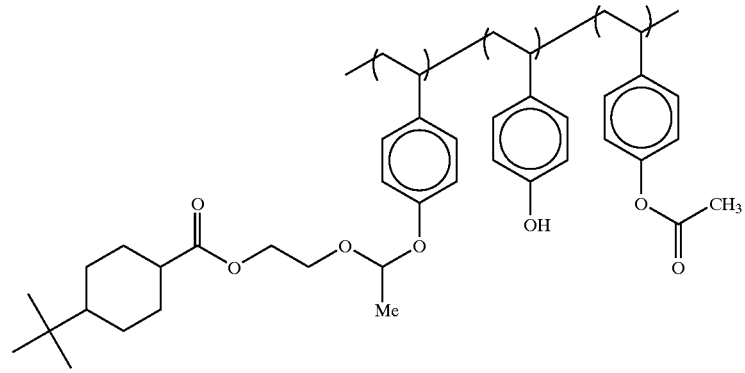
(A-41)

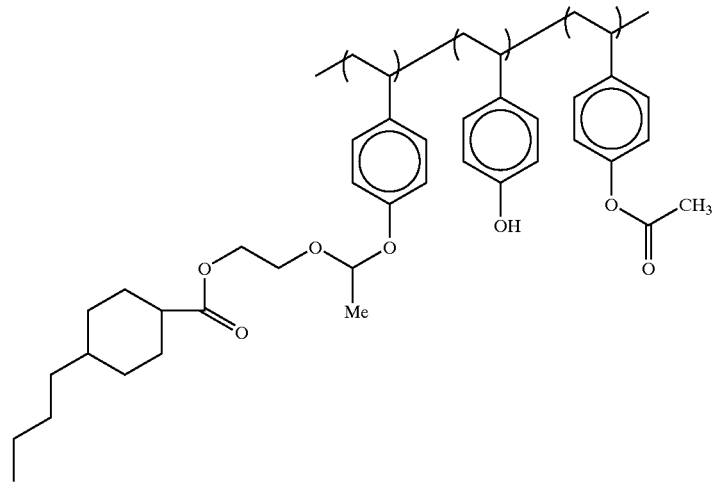
(A-42)
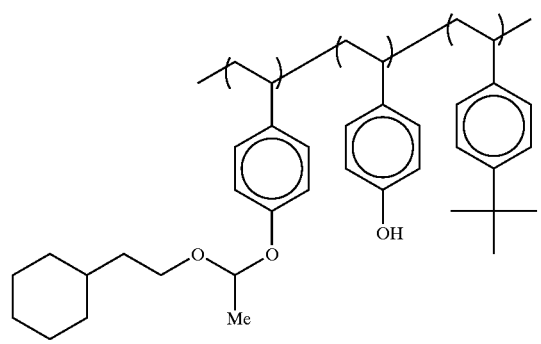
(A-43)
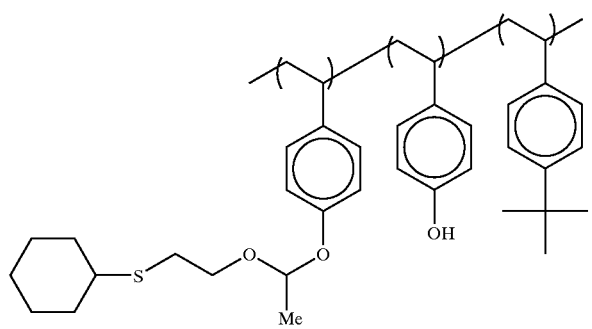
(A-44)
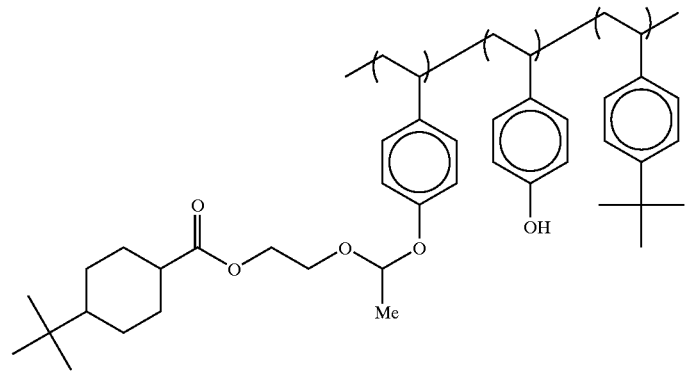
(A-45)

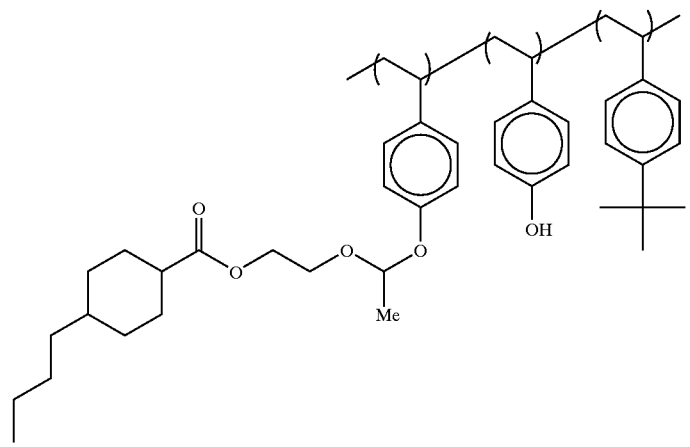

(A-46)

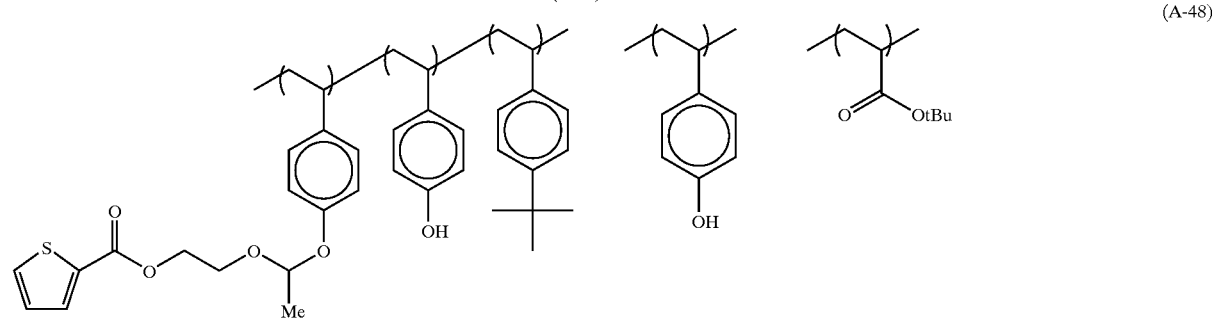

(A-47) (A-48)

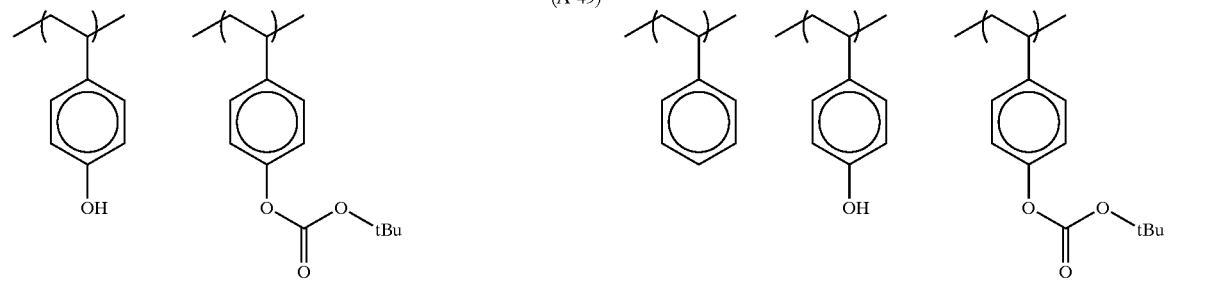

(A-49) (A-50)

(A-51)

In the above-described formulae, Me represents a methyl group, Et represents an ethyl group, n-Bu represents a n-butyl group, iso-Bu represents an isobutyl group and t-Bu represents a tert-butyl group.

In case of using an acetal group as the acid-decomposable group, crosslinking portions connected with polyfunctional acetal groups may be introduced into the polymer main chain by means of adding a polyhydroxy compound in the preparation step thereof in order to control an alkali-dissolution rate and to improve heat-resistance. The amount of the polyhydroxy compound added is preferably from 0.01 to 5 mol %, more preferably from 0.05 to 4 mol %, based on the content of hydroxy group in the resin. The polyhydroxy compound to be used has phenolic hydroxy groups or alcoholic hydroxy groups in an amount of 2 to 6, preferably from 2 to 4 and more preferably from 2 to 3.

Specific examples of the polyhydroxy compound are set forth below, but the present invention should not be construed as being limited thereto.

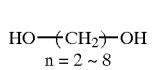

$n = 2 \sim 8$

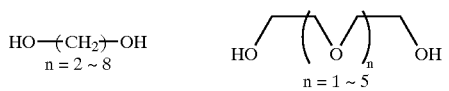

$n = 1 \sim 5$

-continued

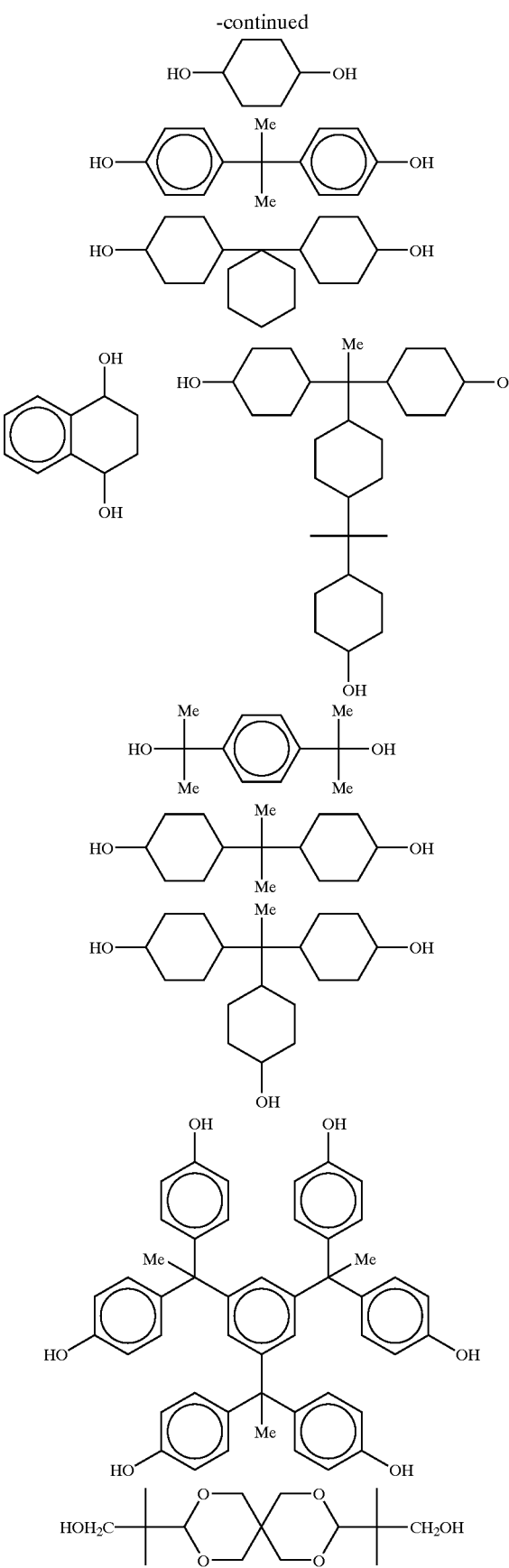

The weight average molecular weight (Mw) of the resin of component (A) having the acid-decomposable group is preferably in a range of from 2,000 to 300,000. If it is less than 2,000, decrease in a film thickness of the unexposed area during development is large and on the other hand, if it exceeds 300,000, a dissolution rate of the resin per se to alkali decreases, resulting in lowering sensitivity. The weight average molecular weight is measured by gel permeation chromatography and defined in terms of polystyrene.

Two or more of the resins of component (A) having the acid-decomposable group may be used in the positive resist composition of the present invention.

The amount of the resin of component (A) is ordinarily from 40 to 99% by weight, preferably from 60 to 98% by weight, based on the solid content of the first composition of the present invention.

[4] (D) A compound having a molecular weight of not more than 3,000 which decomposes by the action of an acid to increase solubility in an alkali developer (Component (D)):

The compound of component (D) is the indispensable component in the second composition of the present invention, and is incorporated into the first component, if desired. The compound of component (D) is a low molecular weight compound which has a group decomposable with an acid, whose solubility in an alkali developer is increased by the action of an acid, and which has a molecular weight of not more than 3,000, preferably from 200 to 2,000, and more preferably from 300 to 1,500. The compound of component (D) functions as a compound for inhibiting dissolution of the unexposed portion in the alkali developer. The term "acid-decomposable dissolution-inhibiting compound" has the same meaning as the compound of component (D) hereinafter.

The compound of component (D), i.e., acid-decomposable dissolution-inhibiting compound is preferably a compound containing at least two acid-decomposable groups in its structure wherein at least 8 connecting atoms other than the acid-decomposable groups are interposed between the acid-decomposable groups which are separated from each other at the greatest distance.

Preferred examples of the acid-decomposable dissolution-inhibiting compound include (a) a compound containing at least two acid-decomposable groups in its structure wherein at least 10, preferably at least 11, more preferably at least 12 connecting atoms other than the acid-decomposable groups are interposed between the acid-decomposable groups which are separated from each other at the greatest distance, and (b) a compound containing at least three acid-decomposable groups in its structure wherein at least 9, preferably at least 10, more preferably at least 11 connecting atoms other than the acid-decomposable groups are interposed between the acid-decomposable groups which are separated from each other at the greatest distance.

The upper limit of the number of the above-described connecting atoms is preferably 50, more preferably 30.

When the acid-decomposable dissolution-inhibiting compound contains three or more, preferably four or more acid-decomposable groups, even two acid-decomposable groups, its dissolution-inhibiting function to the alkali-soluble resin is remarkably enhanced as far as these acid-decomposable groups are separated from each other at the predetermined distance.

The distance between the acid-decomposable groups is represented by the number of connecting atoms interposed therebetween excluding the acid-decomposable groups. For, instance, in the case of compounds (1) and (2) described below, the distance between the acid-decomposable groups is four connecting atoms, respectively. In the case of compound (3) described below, the distance between the acid-decomposable groups is 12 connecting atoms.

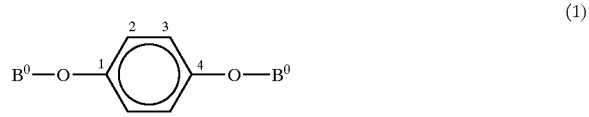
(1)

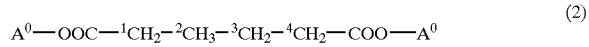
(2)

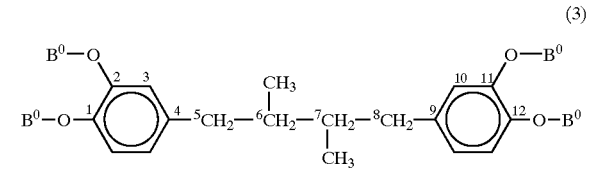
(3)

Acid-decomposable group: —COO—A⁰ or —O—B⁰

Further, the acid-decomposable dissolution-inhibiting compound may have a plurality of acid-decomposable groups on one benzene ring. Preferably, it is a compound formed by a skeleton having one acid-decomposable group on one benzene ring.

A group containing the acid-decomposable group, i.e., a group containing —COO—A⁰ group or —O—B⁰ group is preferably a group represented by formula —R⁰—COO—A⁰ or —Ar—O—B⁰.

In the above formulae, A⁰ represents —C(R⁰¹)(R⁰²)(R⁰³), —Si(R⁰¹)(R⁰²)(R⁰³) or —C(R⁰⁴)(R⁰⁵)—O—R⁰⁶, and B⁰ represents —A⁰ or —CO—O—A⁰.

R⁰¹, R⁰², R⁰³, R⁰⁴ and R⁰⁵, which may be the same or different, each represents a hydrogen atom, an alkyl group, a cycloalkyl group, an alkenyl group or an aryl group, and R⁰⁶ represents an alkyl group or an aryl group. However, at least two of R⁰¹ to R⁰³ are not hydrogen atoms; and two of R⁰¹ to R⁰³ may be bonded to each other to form a ring, and two of R⁰⁴ to R⁰⁶ may be bonded to each other to form a ring. R⁰ represents an aliphatic or aromatic hydrocarbon group having a valence of 2 or higher, which may be substituted, and —Ar— represents a monocyclic or polycyclic aromatic group having a valence of 2 or higher, which may be substituted.

Preferred examples of the alkyl group include those having from 1 to 4 carbon atoms, such as methyl, ethyl, propyl, n-butyl, sec-butyl and tent-butyl. Preferred examples of the cycloalkyl group include those having from 3 to 10 carbon atoms, such as cyclopropyl, cyclobutyl, cyclohexyl and adamantyl.

Preferred examples of the alkenyl group include those having from 2 to 4 carbon atoms, such as vinyl, propenyl, allyl and butenyl.

Preferred examples of the aryl group include those having from 6 to 14 carbon atoms, such as phenyl, xylyl, tolyl, cumenyl, naphthyl and anthryl.

Examples of the substituent include a hydroxy group, a halogen atom (e.g., fluorine, chlorine, bromine or iodine), a nitro group, a cyano group, the above-described alkyl group, an alkoxy group such as methoxy, ethoxy, hydroxyethoxy, propoxy, hydroxypropoxy, n-butoxy, isobutoxy, sec-butoxy or tert-butoxy, an alkoxycarbonyl group such as methoxycarbonyl or ethoxycarbonyl, an aralkyl group such as benzyl, phenethyl or cumyl, an aralkyloxy group, an acyl group such as formyl, acetyl, butyryl, benzoyl, cyanamyl or valeryl, an acyloxy group such as butyryloxy, the above-described alkenyl group, an alkenyloxy group such as vinyloxy, propenyloxy, allyloxy or butenyloxy, the above-described aryl group, an aryloxy group such as phenoxy, and an aryloxycarbonyl group such as benzoyloxy.

Preferred examples of the acid-decomposable group include a silyl ether group, a cumyl ester group, an acetal group, a tetrahydropyranyl ether group, an enol ether group, an enol ester group, a tertiary alkyl ether group, a tertiary alkyl ester group and a tertiary alkylcarbonate group. More preferred examples thereof include a tertiary alkyl ester group, a tertiary alkylcarbonate group, a cumyl ester group and a tetrahydropyranyl ether group.

The compound of component (D) includes compounds formed by connecting to protect a part or all of phenolic hydroxy groups in polyhydroxy compounds as described, for example, in JP-A-1-289946, JP-A-1-289947, JP-A-2-2560, JP-A-3-128959, JP-A-3-158855, JP-A-3-179353, JP-A-3-191351, JP-A-3-200251, JP-A-3-200252, JP-A-3-200253, JP-A-3-200254, JP-A-3-200255, JP-A-3-259149, JP-A-3-279958, JP-A-3-279959, JP-A-4-1650, JP-A-4-1651, JP-A-4-11260, JP-A-4-12356, JP-A-4-12357, Japanese Patent Application No. 3-33229, Japanese Patent Application No. 3-230790, Japanese Patent Application No. 3-320438, Japanese Patent Application No. 4-25157, Japanese Patent Application No. 4-52732, Japanese Patent Application No. 4-103215, Japanese Patent Application No. 4-104542, Japanese Patent Application No. 4-107885, Japanese Patent Application No. 4-107889 and Japanese Patent Application No. 4-152195 with the above-described groups of —R⁰—COO—A⁰ or —B⁰.

More preferred compounds are those formed from the polyhydroxy compounds as described in JP-A-1-289946, JP-A-3-128959, JP-A-3-158855, JP-A-3-179353, JP-A-3-200251, JP-A-3-200252, JP-A-3-200255, JP-A-3-259149, JP-A-3-279958, JP-A-4-1650, JP-A-4-11260, JP-A-4-12356, JP-A-4-12357, Japanese Patent Application No. 4-25157, Japanese Patent Application No. 4-103215, Japanese Patent Application No. 4-104542, Japanese Patent Application No. 4-107885, Japanese Patent Application No. 4-107889 and Japanese Patent Application No. 4-152195.

Specific examples of the preferred compound skeleton for the compound of component (D) are set forth below, but the present invention should not be construed as being limited thereto.

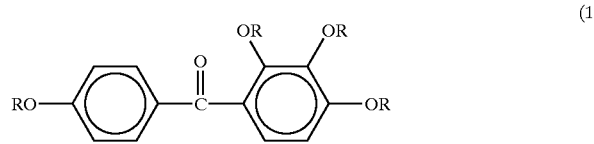
(1)

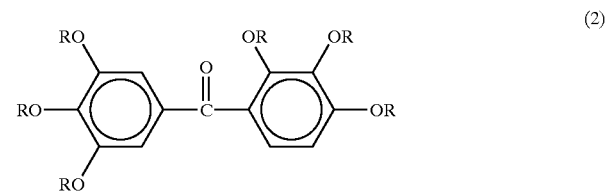
(2)

-continued
(3)
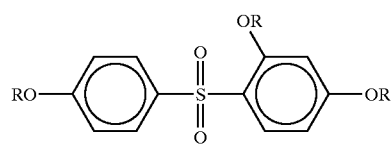
(4)
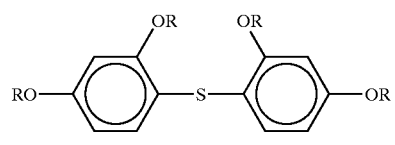
(5)
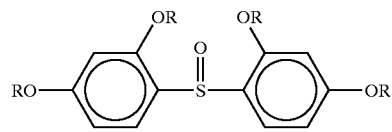
(6)
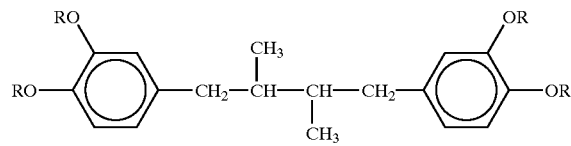
(7)
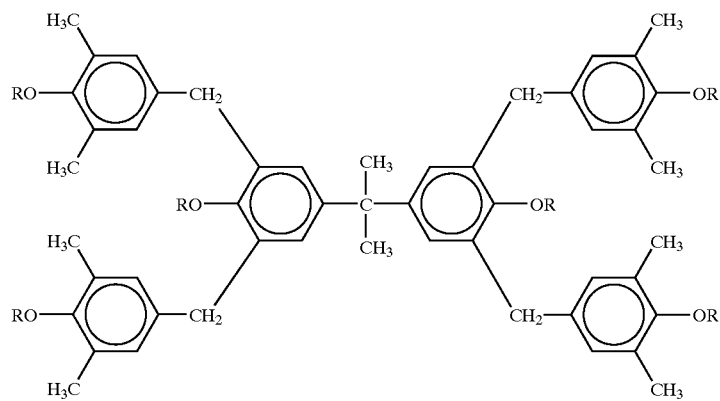
(8)
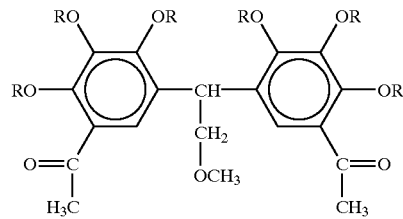
(9)
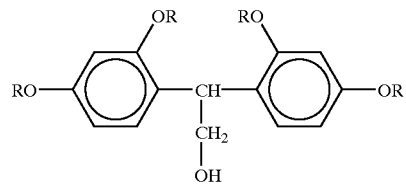
(10)
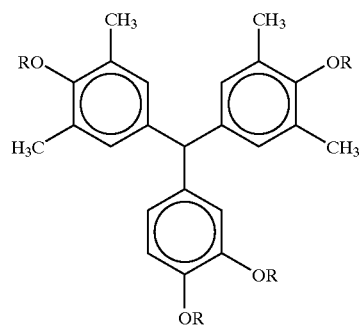
(11)
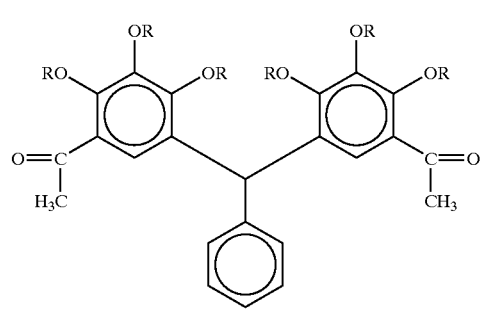
(12)
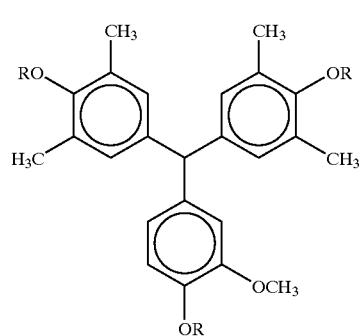
(13)

-continued
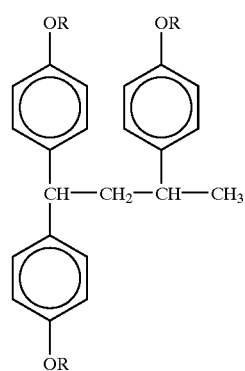
(14)
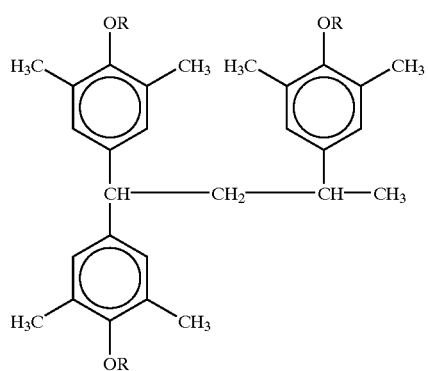
(15)
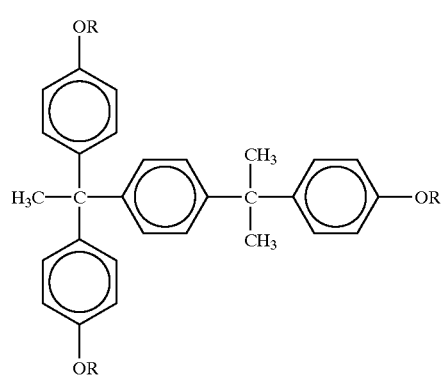
(16)
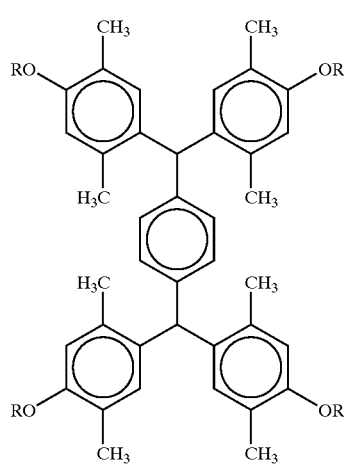
(17)
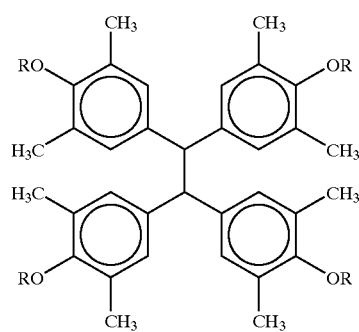
(18)
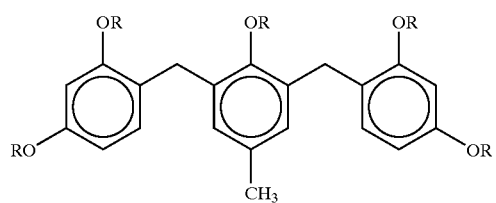
(19)
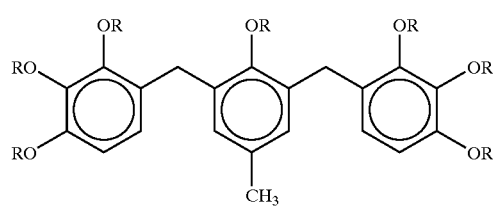
(20)
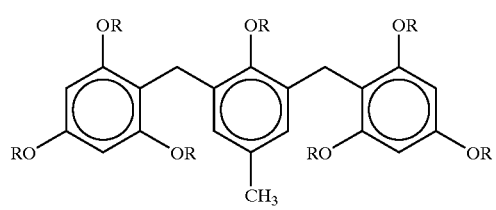
(21)
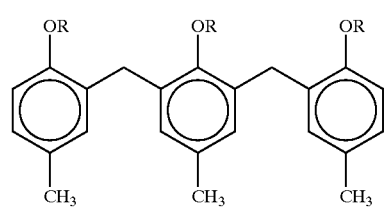
(22)
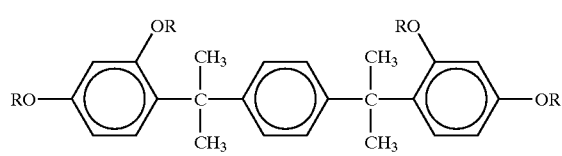
(23)

-continued
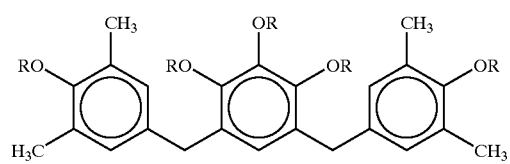
(24)
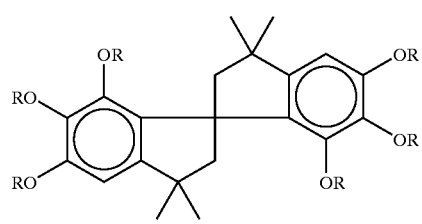
(25)
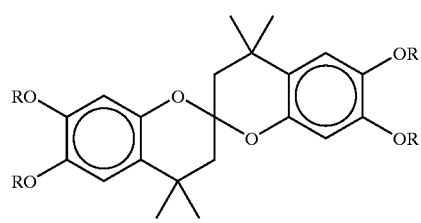
(26)
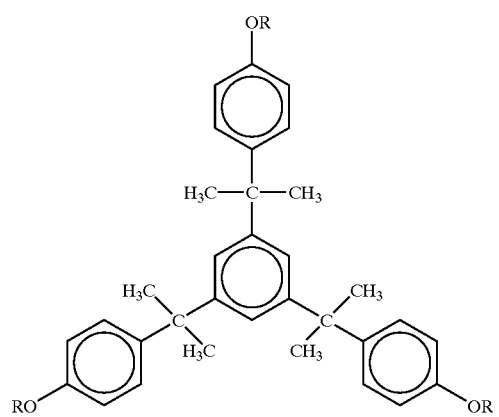
(27)
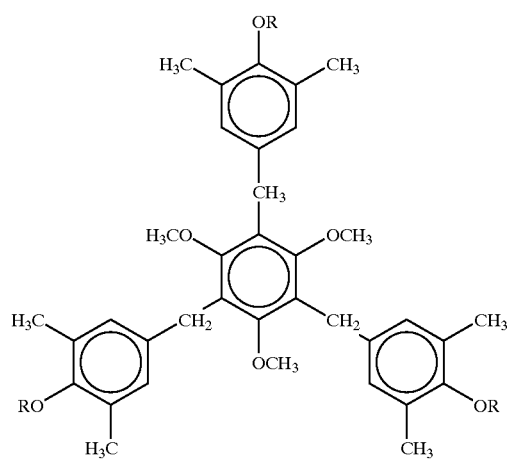
(28)
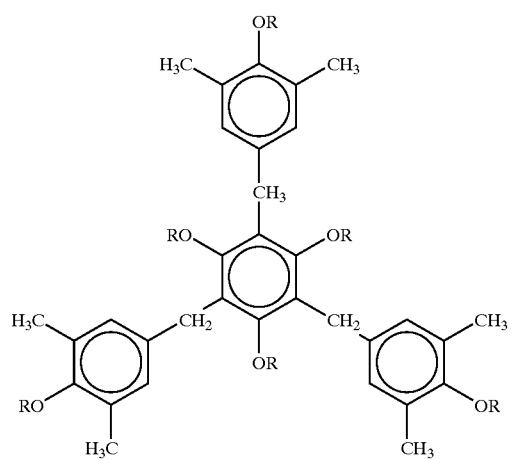
(29)
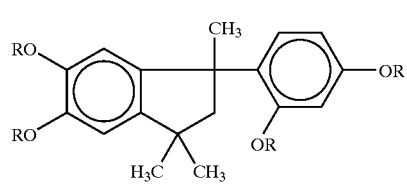
(30)
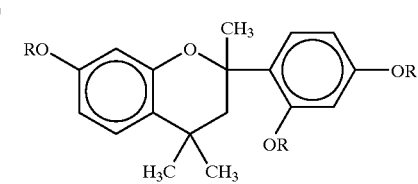
(31)
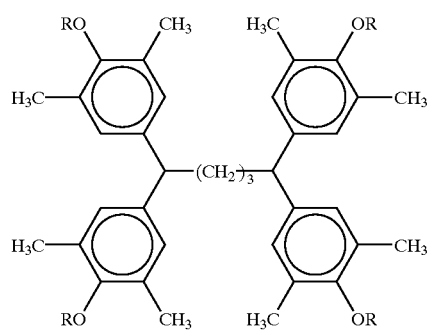
(32)
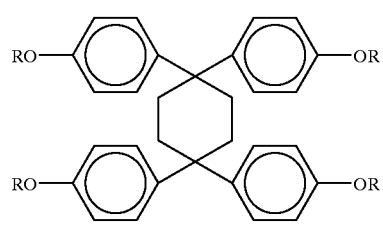
(33)

-continued
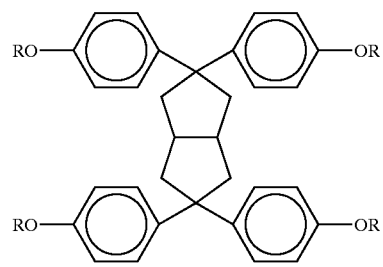 (34)
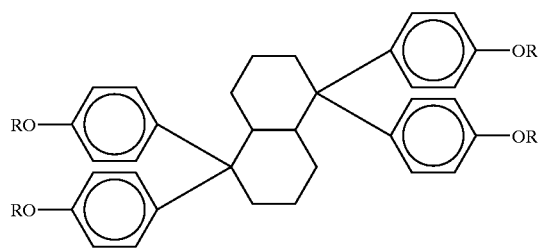 (35)
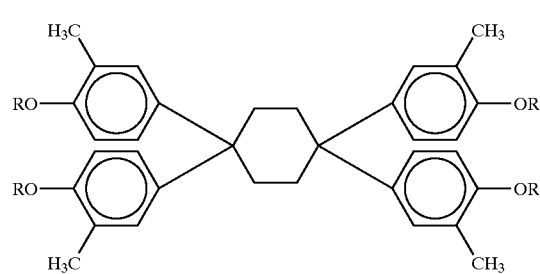 (36)
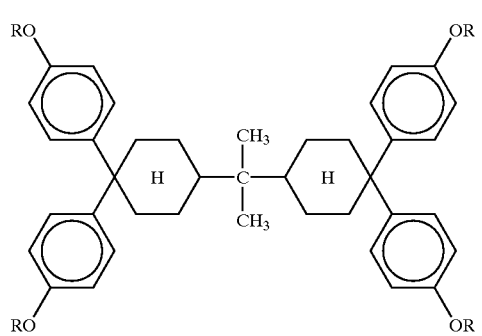 (37)
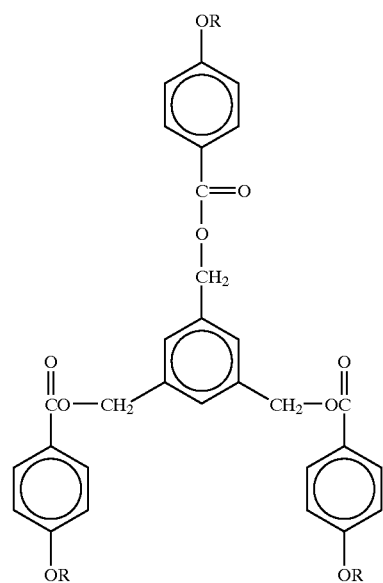 (38)
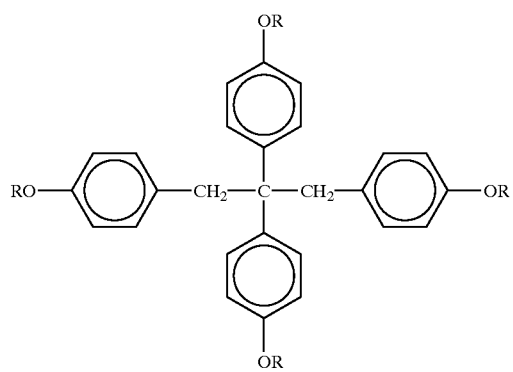 (39)
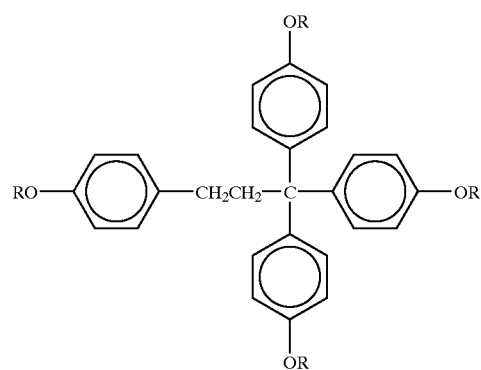 (40)
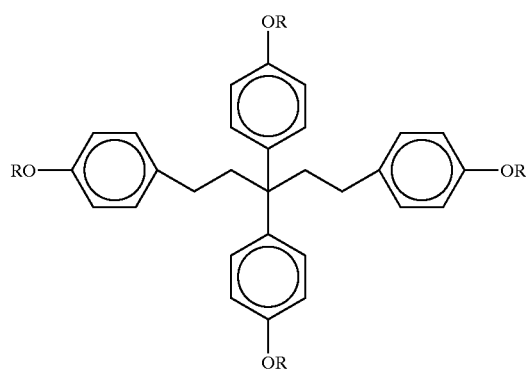 (41)

-continued

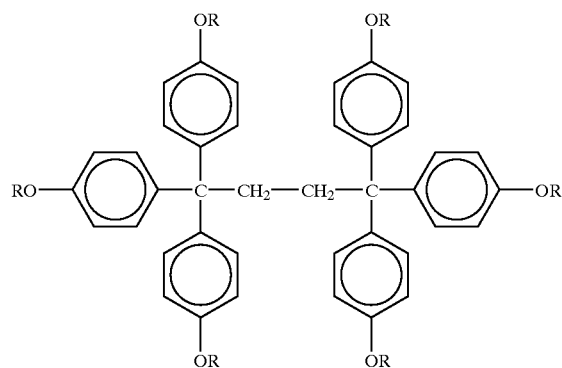
(42)

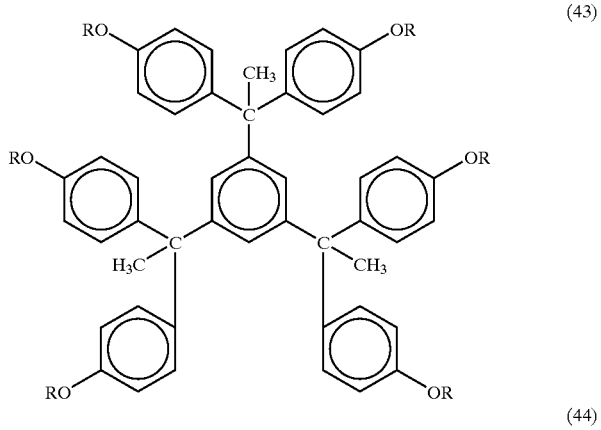
(43)

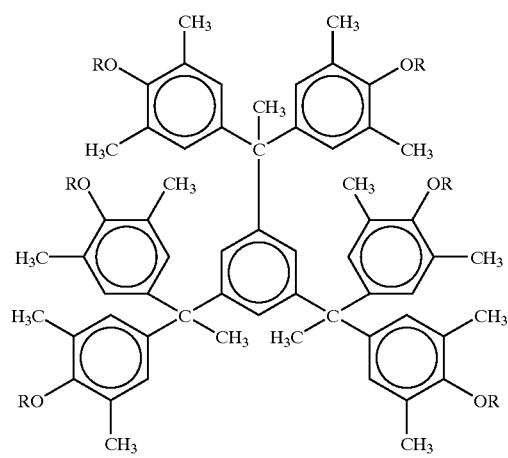
(44)

In the above-described formulae of Compounds (1) to (44), R represents a hydrogen atom, —CH$_2$COOC(CH$_3$)$_2$C$_6$H$_5$, —CH$_2$COOC$_4$C$_9$-tert, —COOC$_4$C$_9$-tert or

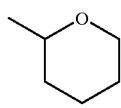

with the proviso that at least two or three, depending on the structure, of R's are groups other than a hydrogen atom and R's may be the same or different.

In the first composition, the content of the compound of component (D) is preferably from 3 to 45% by weight, more preferably from 5 to 30% by weight, and still more preferably from 10 to 20% by weight, based on the solid content of the first composition.

The content of the compound of component (D) in the second composition is same as that in the first composition.

[5] (E) An alkali-soluble resin (Component (E)):

The alkali-soluble resin of component (E) is the indispensable component in the second composition of the present invention. The alkali-soluble resin is a component which may be added to the first composition of the present invention. The alkali-soluble resin of component (E) is a resin which is water-insoluble but soluble in an alkali developer and used for controlling the solubility of the second composition in alkali. The alkali-soluble resin dose not substantially have the acid-decomposable group.

Examples of the resin of component (E) include novolak resin, hydrogenated novolak resin, acetone-pyrogallol resin, o-polyhydroxystyrene, m-polyhydroxystyrene, p-polyhydroxystyrene, hydrogenated polyhydroxystyrene, halogen- or alkyl-substituted polyhydroxystyrene, hydroxystyrene/N-substituted maleimide copolymer, o/p- or m/p-hydroxystyrene copolymer, partially O-alkylated product of hydroxyl groups in polyhydroxystyrene (e.g., 5 to 30 mol % O-methylated product, O-(1-methoxy)ethylated product or O-(1-ethoxy)ethylated product, 0-2-tetrahydropyranylated product, or O-(tert-butoxycarbonyl) methylated product), partially o-acylated product of hydroxyl groups in polyhydroxystyrene (e.g., 5 to 30 mol % O-acetylated product or O-(tert-butoxy)carbonylated product), styrene/maleic anhydride copolymer, styrene/ hydroxystyrene copolymer, α-methylstyrene/ hydroxystyrene copolymer, carboxy group-containing methacrylic resin and derivative thereof, and polyvinyl alcohol derivative. However, the present invention should not be construed as being limited thereto.

Particularly preferred examples of the alkali-soluble resin of component (E) include novolak resin, o-polyhydroxystyrene, m-polyhydroxystyrene, p-polyhydroxystyrene and copolymer thereof, alkyl-substituted polyhydroxystyrene, partially O-alkylated product of polyhydroxystyrene, partially O-acylated product of polyhydroxystyrene, styrene/hydroxystyrene copolymer, and α-methylstyrene/hydroxystyrene copolymer. The above-described novolak resin can be obtained by subjecting a specific monomer as a main component to an addition condensation reaction with an aldehyde in the presence of an acid catalyst.

A weight average molecular weight of the novolak resin is preferably in a range of from 1,000 to 30,000. If the weight average molecular weight thereof is less than 1,000, decrease in a film thickness of the unexposed area after development is large. On the other hand, if the weight average molecular weight thereof exceeds 30,000, a developing rate decreases. A particularly preferred range of the weight average molecular weight of the novolak resin is from 2,000 to 20,000.

The poly(hydroxystyrene)s and derivatives and copolymers thereof described above other than the novolak resin each has a weight average molecular weight of ordinarily not less than 2,000, preferably from 5,000 to 200,000, more preferably from 8,000 to 100,000. Further, from a standpoint of improvement in heat resistance of the resist film, the weight average molecular weight is preferably not less than 10,000.

The weight average molecular weight used herein means that measured by gel permeation chromatography and defined in terms of polystyrene.

In the composition of the present invention, the alkali-soluble resins may be used as a mixture of two or more thereof.

The content of the alkali-soluble resin is preferably from 40 to 97% by weight, more preferably from 60 to 90% by weight, based on the solid content of the second composition.

[6] (F) A nitrogen-containing basic compound (component (F)):

The nitrogen-containing basic compound of component (F) which is used in the positive resist composition of the present invention is preferably a compound which has basicity stronger than phenol. Among these, the nitrogen-containing basic compounds having a structure represented by formulae (A), (B), (C), (D) and (E) shown below are preferred. By the use of the nitrogen-containing basic compound, change in performance of the resist composition with the lapse of time from exposure to post-baking is restrained.

(A)

wherein $R^{250}$, $R^{251}$ and $R^{252}$, which may be the same or different, each represents a hydrogen atom, an alkyl group having from 1 to 12 carbon atoms which may be substituted, an aminoalkyl group having from 1 to 12 carbon atoms which may be substituted, a hydroxyalkyl group having from 1 to 12 carbon atoms which may be substituted or an aryl group having from 6 to 20 carbons atoms which may be substituted, or $R^{251}$ and $R^{252}$ may be combined with each other to form a ring;

(B)

(C)

(D)

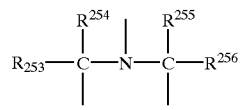
(E)

wherein $R^{253}$, $R^{254}$, $R^{255}$ and $R^{256}$, which may be the same or different, each represents an alkyl group having from 1 to 6 carbon atoms.

Preferred examples of the nitrogen-containing basic compound include a substituted or unsubstituted guanidine, a substituted or unsubstituted aminopyridine, a substituted or unsubstituted aminoalkylpyridine, a substituted or unsubstituted aminopyrrolidine, a substituted or unsubstituted indazole, a substituted or unsubstituted pyrazole, a substituted or unsubstituted pyrazine, a substituted or unsubstituted pyrimidine, a substituted or unsubstituted purine, a substituted or unsubstituted imidazoline, a substituted or unsubstituted pyrazoline, a substituted or unsubstituted piperazine, a substituted or unsubstituted aminomorpholine, a substituted or unsubstituted aminoalkylmorpholine, a mono- di- or tri-amine, a substituted or unsubstituted aniline, a substituted or unsubstituted piperidine and a mono- or di-ethanolamine. The substituent includes preferably an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group and a cyano group.

More preferred examples of the compound include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine, 1,5-diazabicyclo[4.3.0]non-5-ene, 1,8-diazabicyclo[5.4.0]undec-7-ene, 2,4,5-triphenylimidazole, tri(n-butyl)amine, tri(n-octyl)amine, N-phenyldiethanolamine, N-hydroxyethylpiperidine, 2,6-diisopropylaniline, N-cyclohexyl-N'-morpholinoethylthiourea and N-hydroxyethylmorpholine. However, the present invention should not be construed as being limited thereto.

Of these compounds, 1,5-diazabicyclo[4.3.0]non-5-ene, 1,8-diazabicyclo[5.4.0]undec-7-ene, 2,4,5-triphenylimidazole, tri(n-butyl)amine, tri(n-octyl)amine, N-phenyldiethanolamine, N-hydroxyethylpiperidine, 2,6-diisopropylaniline, N-cyclohexyl-N'-morpholinoethylthiourea and N-hydroxyethylmorpholine are particularly preferred.

The nitrogen-containing basic compounds are used individually or in combination of two or more thereof.

The amount of the nitrogen-containing basic compound used is ordinarily from 0.001 to 10% by weight, preferably from 0.01 to 5% by weight, based on the solid content of the resist composition. If the amount used is less than 0.001% by weight, the effect owing to the addition of the nitrogen-containing basic compound may not be obtained, whereas if it exceeds 10% by weight, reduction in sensitivity or deterioration in developing property of the unexposed area is liable to occur.

[7] (G) a surfactant containing at least one of a fluorine atom and a silicon atom (Component (G)):

It is preferred that the resist composition of the present invention contains a surfactant of component (G). The surfactant of component (G) is selected from a fluorine-base surfactant, a silicon-base surfactant and a surfactant having both a fluorine atom and a silicon.

The positive resist composition containing the fluorine-base or silicon-base surfactant according to the present invention is excellent in sensitivity, resolution, adhesion property to a substrate and dry etching resistivity when an exposure light source having a wavelength of 250 nm or less, particularly 220 nm or less is used. Also, the occurrence of particles during the preservation of the resist composition is restrained. Further, a resist pattern with less development defect and scum is obtained.

Examples of the fluorine-base or silicon-base surfactant include those described, for example, in JP-A-62-36663, JP-A-61-226746, JP-A-61-226745, JP-A-62-170950, JP-A-63-34540, JP-A-7-230165, JP-A-8-62834, JP-A-9-54432 and JP-A-9-5988. Commercially available surfactants are also employed as they are.

Examples of commercially available surfactants which can be used include fluorine-base surfactants and silicon-base surfactants, for example, Eftop EF301 and EF303 (manufactured by Shin Akita Chemical Co., Ltd.), Florad FC430 and FC431 (manufactured by Sumitomo 3M Ltd.), Megafac F171, F173, F176, F189 and R08 (manufactured by Dainippon Ink and Chemicals, Inc.), Surflon S-382, SC101, SC102, SC103, SC104, SC105 and SC106 (manufactured by Asahi Glass Co., Ltd.), and Troysol S-366 (manufactured by Troy Chemical Industries, Inc.). Also, polysiloxane polymer KP-341 (manufactured by Shin-Etsu Chemical Co., Ltd.) is employed as the silicon-base surfactant.

The amount of the fluorine-base or silicon-base surfactant added is ordinarily from 0.001 to 2% by weight, preferably from 0.01 to 1% by weight, based on the solid content of the resist composition of the present invention. The surfactants may be used individually or in combination of two or more thereof.

[8] Other components usable in the resist composition of the present invention:

The positive resist composition of the present invention may further contain, if desired, a dye, a pigment, a plasticizer, a surfactant other than the fluorine-base or silicon-base surfactant described above, a photosensitizer, a compound having two or more phenolic OH groups, which accelerates the solubility in a developing solution, and the like.

The compound containing two or more phenolic OH groups, which can be used in the present invention, is preferably a phenol compound having a molecular weight of not more than 1,000. The phenol compound needs to contain at least two phenolic hydroxyl groups in its molecule. However, if the number of phenolic hydroxyl groups contained in the phenol compound exceeds 10, the desired effect for improving development latitude is lost. Further, if the ratio of phenolic hydroxyl group to aromatic ring is less than 0.5, the dependence on film thickness becomes large and the development latitude tends to narrow. On the other hand, it is not preferred that the ratio exceeds 1.4, since stability of the resulting resist composition deteriorates and it is difficult to obtain high resolution and good dependence on film thickness.

The amount of the phenol compound added is preferably from 2 to 50% by weight, more preferably from 5 to 30% by weight, based on the amount of the alkali-soluble resin. If the amount of the phenol compound added exceeds 50% by weight, development residue increases adversely and a new problem disadvantageously arises such that the pattern deforms during the development.

The above-described phenol compound having a molecular weight of not more than 1,000 can be easily synthesized by one skilled in the art making reference to the methods described, for example, in JP-A-4-122938, JP-A-2-28531, U.S. Patent No. 4,916,210 and European Patent 219,294.

Specific examples of the phenol compound are set forth below, however, the compound which can be used in the present invention should not be construed as being limited thereto.

Resorcinol, phloroglucinol, 2,3,4-trihydroxybenzophenone, 2,3,4,4'-tetrahydroxybenzophenone, 2,3,4,3',4',5'-hexahydroxybenzophenone, acetone-pyrogallol condensed resin, phloroglucoside, 2,4,2',4'-biphenyltetrol, 4,4'-thiobis (1,3-dihydroxy) benzene, 2,2',4,4'-tetrahydroxydiphenyl ether, 2,2',4,4'-tetrahydroxydiphenyl sulfoxide, 2,2',4,4'-tetrahydroxydiphenylsulfone, tris(4-hydroxyphenyl)methane, 1,1-bis(4-hydroxyphenyl)cyclohexane, 4,4-(α-methylbenzylidene)bisphenol, α,α',α"-tris (4-hydroxy-phenyl)-1,3,5-triisopropylbenzene, α, α',α"-tris (4-hydroxyphenyl)-1-ethyl-4-isopropylbenzene, 1,2,2-tris (hydroxyphenyl)propane, 1,1,2-tris(3,5-dimethyl-4-hydroxyphenyl)propane, 2,2,5,5-tetrakis(4-hydroxyphenyl)-hexane, 1,2-tetrakis(4-hydroxyphenyl)ethane, 1,1,3-tris (hydroxyphenyl)butane and para[α,α,α',α'-tetrakis (4-hydroxyphenyl)]xylene.

<Preparation of the Positive Resist Composition and Use Thereof>

A method for the preparation of positive resist composition and a method for the use thereof will be described below.

The resist composition of the present invention is dissolved in a solvent which can dissolve the above-described respective components, and then coated on a support. The solvent used includes preferably ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, propylene glycol monoethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone and tetrahydrofuran. The solvents may be used individually or in combination of two or more thereof.

Of the solvents described above, 2-heptanone, γ-butyrolactone, ethylene glycol monomethyl ether, ethylene glycol monoethyl ether, ethylene glycol monoethyl ether acetate, propylene glycol monomethyl ether, propylene glycol monomethyl ether acetate, propylene glycol monoethyl ether acetate, methyl lactate, ethyl lactate, methyl methoxypropionate, ethyl ethoxypropionate, N-methylpyrrolidone and tetrahydrofuran are more preferably used.

It is preferred to add the fluorine-base or silicon-base surfactant of component (G) described above to the solvent.

Further, a surfactant other than the fluorine-base or silicon-base surfactant of component (G) may be added. Specific examples of such a surfactant include a nonionic surfactant, for example, a polyoxyethylene alkyl ether such as polyoxyethylene lauryl ether, polyoxyethylene stearyl ether, polyoxyethylene cetyl ether or polyoxyethylene oleyl ether, a polyoxyethylene alkylaryl ether such as polyoxyethylene octylphenol ether or polyoxyethylene nonylphenol ether, a polyoxyethylene/polyoxypropylene block copolymer, a sorbitan fatty acid ester such as sorbitan monolaurate, sorbitan monopalmitate, sorbitan monostearate, sorbitan monooleate, sorbitan trioleate or sorbitan tristearate, and a polyoxyethylene sorbitan fatty acid ester such as polyoxyethylene sorbitan monolaurate, polyoxyethylene sorbitan monopalmitate, polyoxyethylene sorbitan monostearate, polyoxyethylene sorbitan trioleate or polyoxyethylene sorbitan tristearate, and an crylic or methacrylic (co) polymer (Polyflow No. 75 and NO. 95 manufactured by Kyoei Yusi Kagaku Kogyo Co., Ltd.).

The amount of the surfactant added is ordinarily not more than 2 parts by weight, preferably not more than 1 part by weight, based on 100 parts by weight of the solid content of the resist composition of the present invention.

The above-described resist composition is coated on a substrate (e.g., silicon/silicon dioxide coating) for use in the production of a precision integrated circuit element by an appropriate coating means such as a spinner or coater, exposed through a predetermined mask, baked and developed to thereby obtain a good resist pattern.

A developing solution which can be used for the resist composition according to the present invention is an alkaline aqueous solution of an inorganic alkali such as sodium hydroxide, potassium hydroxide, sodium carbonate, sodium silicate, sodium metasilicate or aqueous ammonia, a primary amine such as ethylamine or n-propylamine, a secondary amine such as diethylamine or di-n-butylamine, a tertiary amine such as triethylamine or methyldiethylamine, a n alcohol amine such as dimethylethanolamine or triethanolamine, a quaternary ammonium salt such as tetramethylammonium hydroxide or tetraethylammonium hydroxide, and a cyclic amine such as pyrrole or piperidine.

To the alkaline aqueous solution, an appropriate amount of an alcohol or surfactant may be added. The positive resist composition of the present invention is excellent in a lithographic technology using a light source having a short wavelength capable of conducting the ultra fine fabrication and a chemical amplification-type positive resist, since it has good resolution, provides a good profile without extraneous substances on surface and exhibits a broad range in depth of focus.

The present invention will be described in greater detail with reference to the following examples, however, the present invention should not be construed as being limited thereto.

SYNTHESIS EXAMPLE 1

Synthesis of Compound (IIs-1)(Component (B))

(1) Synthesis of Triphenylsulfonium 3,5-bis (trifluoromethyl)phenylsulfonate(Compound (IIs-1)

In 300 ml of methanol was dissolved 17.5 g of triphenylsulfonium iodide. To the solution was added 10.9 g of silver oxide and the mixture was stirred for 4 hours at a room temperature. The reaction solution was subjected to filtration.

Separately, 14.7 g of 3,4-bis(trifluoromethyl) benzenesulfonyl chloride was dissolved in a mixture of 100 ml of methanol and 100 ml of water, to the solution was added dropwise a 10% methanol solution of tetramethylammonium hydroxide (TMAH) under cooling with ice and the mixture was reacted for one hour at 50° C., followed by allowing to cool. The reaction mixture was acidified by adding hydrochloric acid and then added to the above-described reaction solution, followed by stirring at room temperature.

The reaction solution was concentrated and to the residue was added chloroform. The mixture was washed twice with a solution of TMAH and then twice with water and concentrated. The resulting solid was recrystallized from a solvent mixture of diisopropyl ether and ethyl acetate to obtain 22 g of the desired compound.

In the same manner as described above, various compounds of component (B) were synthesized.

SYNTHESIS EXAMPLE 2

Synthesis of Resin (Component (A))

(1) Synthesis of p-[1-(2-Cyclohexylethoxy)ethoxy]styrene/p-hydroxystyrene (30/70) (Resin (A-25))>

In 320 g of propylene glycol monomethyl ether acetate (PGMEA) was dissolved 70 g of poly(p-hydroxystyrene) (VP-8000, manufactured by Nippon Soda Co., Ltd.) with heating and the solution was subjected to dehydration by distillation under a reduce pressure and cooled to 20° C. To the solution were added 0.35 g of pyridinium p-toluenesulfonate and 22.4 g of 2-cyclohexylethanol. Then, 17.5 g of tert-butyl vinyl ether was gradually added to the solution, followed by reacting at 20° C. for 5 hours. To the reaction mixture were added 0.28 g of triethylamine and 320 ml of ethyl acetate and the mixture was washed three times with each 150 ml of distilled water. The solvent was distilled off to concentrate, the resulting oily substance was dissolved in 100 ml of acetone and the solution was gradually poured into 2 liters of distilled water. The powder thus-deposited was collected by filtration and dried to obtain 54 g of the desired compound. The Mw of the resin was 12,000 and the molecular weight distribution (Mw/Mn) thereof was 1.1.

(2) <Synthesis of p-[1-(2-Cyclohexylethoxy)ethoxy] styrene/p-acetoxystyrene/p-hydroxystyrene (30/10/60) (Resin (A-38))>

In 320 g of propylene glycol monomethyl ether acetate (PGMEA) was dissolved 70 g of poly(p-hydroxystyrene) (VP-8000, manufactured by Nippon Soda Co., Ltd.) with heating and the solution was subjected to dehydration by distillation under a reduce pressure and cooled to 20° C. To the solution were added 0.35 g of pyridinium p-toluenesulfonate and 22.4 g of 2-cyclohexylethanol. Then, 17.5 g of tert-butyl vinyl ether was gradually added to the solution, followed by reacting at 20° C. for 5 hours. To the reaction mixture was added 5.53 g of pyridine and then gradually added 5.9 g of acetic anhydride, followed by reacting at a room temperature for one hour. To the reaction mixture was added 320 ml of ethyl acetate and the mixture was washed three times with each 150 ml of distilled water. The solvent was distilled off to concentrate, the resulting oily substance was dissolved in 100 ml of acetone and the solution was gradually poured into 2 liters of distilled water. The powder thus-deposited was collected by filtration and dried to obtain 58 g of the desired compound. The Mw of the resin was 12,000 and the molecular weight distribution (Mw/Mn) thereof was 1.1.

(3) In the same manner as described in items (1) and (2) above, the following resins were synthesized:

Resin (A-3): p-(1-Ethoxyethoxy)styrene/p-hydroxystyrene (35/65) (molecular weight: 15,000, molecular weight distribution (Mw/Mn): 1.1)

Resin (A-7): p-(1-iso-Butoxyethoxy)styrene/p-hydroxystyrene (30/70) (molecular weight: 6,000, molecular weight distribution (Mw/Mn): 1.2)

Resin (A-14): p-(1-iso-Butoxyethoxy)styrene/ p-(tert-butoxycarbonylmethyleneoxy)styrene/p-hydroxystyrene (20/10/70) (molecular weight: 10,000, molecular weight distribution (Mw/Mn): 1.2)

Resin (A-36): p-(1-Phenethyloxyethoxy)styrene/p-acetoxystyrene/p-hydroxystyrene (30/10/60) (molecular weight: 11,000, molecular weight distribution (Mw/Mn): 1.2)

Resin (A-41) p-[1-(4-tert-Butylcyclohexylcarboxyethoxy)-ethoxy]styrene/p-acetoxystyrene/p-hydroxystyrene (30/10/60) (molecular weight: 12,000, molecular weight distribution (Mw/Mn): 1.1)

Resin (A-43) p-[1-(2-Cyclohexylethoxy)ethoxy]styrene/p-tert-butylstyrene/p-hydroxystyrene (30/8/62) (molecular weight: 18,000, molecular weight distribution (Mw/Mn): 2.3)

Resin (A-22): p-(1-Benzyloxyethoxy)styrene/p-hydroxystyrene (25/75) (molecular weight: 13,000, molecular weight distribution (Mw/Mn): 1.3)

Resin (A-35): p-(1-Benzyloxyethoxy)styrene/p-hydroxystyrene/p-acetoxystyrene (20/70/10) (molecular weight: 9,000, molecular weight distribution (Mw/Mn): 1.2)

Further, the following resins of component (A) were synthesized.

(4) <Synthesis of p-Hydroxystyrene/tert-butyl acrylate (79/21) (Resin (A-48)>

In 150 g of dioxane were dissolved 84.1 g of p-vinylphonol and 22.4 g of tert-butyl acrylate and nitrogen gas was introduced to the solution for one hour. To the solution was added 6.91 g of dimethyl 2,2'-azobisisobutyrate and the mixture was heated to 75° C. under a nitrogen gas stream for 12 hours to conduct polymerization. After the completion of the polymerization, the reaction mixture was cooled to a room temperature. Then, 150 g of acetone was added to the mixture to dilute and the mixture was dropwise added to a large amount of hexane to obtain a solid polymer. The dilution with acetone and dropwise addition to hexane were repeated three times, thereby removing the residual monomers. The resulting polymer was dried at 60° C. under a reduced pressure to obtain Resin (A-48) As a result of the analysis by NMR, the ratio of p-vinylphenol/tert-butyl acrylate was 79/21. The Mw of the resin was 12,000 and the molecular weight distribution (Mw/Mn) thereof was 2.6.

(5) Synthesis of p-(1-iso-Butoxyethoxy) styrene/p-hydroxystyrene/tert-butyl acrylate (20/59/21) (Resin (A-16)>

In 80 g of propylene glycol monomethyl ether acetate (PGMEA) was dissolved 20 g of Resin (A-48) described above and the solution was heated to 60° C., then gradually reduced the pressure to 20 mmHg to remove the PGMEA and water in the system by azeotropic distillation. Thereafter, the solution was cooled to 20° C. and 2.2 g of isobutyl vinyl ether and then 3 mg of p-toluenesulfonic acid were added thereto, followed by reacting for 2 hours. A small amount of triethylamine was added to the solution to neutralize the acid. Then, ethyl acetate was poured into the reaction solution and the mixture was washed with ion-exchanged water to remove the salt. The ethyl acetate and water were distilled off under a reduced pressure from the mixture to obtain Resin (A-16). The Mw of the resin was 12,000 and the molecular weight distribution (Mw/Mn) thereof was 2.5.

(6) p-Hydroxystyrene/styrene/tert-butyl acrylate (78/7/15) (molecular weight: 13,100, molecular weight distribution (Mw/Mn):2.7) (Resin (A-51) was synthesized in a similar manner to Synthesis of Resin (A-48) described above.

(7) Synthesis of p-Hydroxystyrene/p-(tert-butoxycarbonyloxy)styrene (60/40) (Resin (A-49))

In 40 ml of pyridine was dissolved poly(p-hydroxystyrene) (VP-8000, manufactured by Nippon Soda Co., Ltd., weight average molecular weight: 11,000) and to the solution was added 1.28 g of di-tert-butyl dicarbonate at a room temperature with stirring. The solution was reacted at a room temperature for 3 hours and poured into a solution of one liter of ion-exchanged water and 20 g of concentrated hydrochloric acid. The powder thus-deposited was collected by filtration, washed with water and dried to obtain p-hydroxystyrene/p-(tert-butoxycarbonyloxy)-styrene (60/40) copolymer. The Mw of the resin was 12,000 and the molecular weight distribution (Mw/Mn) thereof was 1.1.

EXAMPLES 1 TO 33 AND COMPARATIVE EXAMPLES 1 TO 4

Each of the components described in Table 1 shown below was dissolved in each of the solvents described in Table 1 shown below in such a proportion as to result in a solid content of 15% by weight and filtered through a polyethylene filter of 0.1 gm to prepare positive photoresist solutions for Examples 1 to 33 and Comparative Examples 1 to 4, respectively. The positive resist solutions were evaluated in the following manner:

A: Evaluation on Exposure with KrF Excimer Laser

The positive resist solution was uniformly coated on a silicon wafer subjected to treatment with hexamethyldisilazane using a spin coater and dried by heating at 120° C. for 90 seconds on a hot plate to prepare a resist film having a thickness of 0.6 $\mu$m. The resist film was subjected to pattern exposure with a KrF excimer laser stepper (NA=0.60) using a mask pattern composed of lines and spaces. After the pattern exposure, the resist film was immediately heated at 110° C. for 90 seconds on a hot plate. Then, the resist film was developed with a 2.38% by weight aqueous tetramethyl ammonium hydroxide solution at 23° C. for 60 seconds, rinsed with pure water for 30 seconds and dried. The resist pattern formed on the silicon wafer was evaluated its resist performance in the manner described below. The results obtained are shown in Table 2 below.

Resolution

The resolution is represented by a threshold resolution in the exposure amount necessary for reproducing a mask pattern composed of lines and spaces (1/1) each having a width of 0.18 $\mu$m.

Depth of Focus of Isolated Pattern

The resist film was exposed in an exposure amount necessary for reproducing an isolated pattern having a width of 0.15 $\mu$m while moving a focus position up and down, and a range of focus wherein the isolated pattern having a width of 0.15 $\mu$m could be resolved was measured to determine the depth of focus. The larger the value is, the broader the depth of focus.

Extraneous Substance on Surface

With the resist pattern obtained above, the surface thereof was observed by a scanning electron microscope to determine whether the extraneous substance was present or not. A case wherein the extraneous substance was not observed was indicated as 0 and a case wherein the extraneous substance was observed even a little was indicated as X.
Profile The resist pattern obtained above was observed by a scanning electron microscope to examine the profile. A case wherein a rectangular profile was obtained was indicated as 0 and a case wherein a tapered profile or a profile having a rounded top was indicated as X.

TABLE 1

| Example | (A) | | (B) | | (C1) | | (C2) | (C3) | (D) | (F) | (F') | (G) | (H) |
|---|---|---|---|---|---|---|---|---|---|---|---|---|---|
| 1 | (A-3) 10 g | | (Is-1) 0.5 g | | nil | | Nil | nil | nil | (1) 0.025 g | nil | (W1) 0.03 g | PGMEA |
| 2 | (A-7) 10 g | | (Is-1) 0.5 g | | nil | | Nil | nil | nil | (2) 0.025 g | nil | (W2) 0.03 g | PGMEA |
| 3 | (A-14) 10 g | | (Is-5) 0.5 g | | nil | | Nil | nil | nil | (3) 0.025 g | nil | (W3) 0.03 g | PGMEA |
| 4 | (A-16) 10 g | | (IIs-18) 0.5 g | | nil | | Nil | nil | nil | (4) 0.025 | nil | (W4) 0.03 g | PGMEA |
| 5 | (A-25) 10 g | | (IIs-6) 0.5 g | | nil | | Nil | nil | nil | (1) 0.03 g | nil | (W1) 0.03 g | PGMEA |
| 6 | (A-36) 10 g | | (IIs-1) 0.5 g | | nil | | Nil | nil | nil | (2) 0.005 g | nil | (W4) 0.03 g | PGMEA |
| 7 | (A-38) 10 g | | (IIs-1) 0.5 g | | nil | | Nil | nil | nil | (2) 0.02 g | nil | (W2) 0.03 g | PGMEA |
| 8 | (A-38) 10 g | | (Is-1) 0.5 g | | nil | | Nil | nil | nil | (2) 0.025 g | nil | (W4) 0.05 g | PGMEA/PGME =8/2 |
| 9 | (A-43) 10 g | | (IIs-29) 0.5 g | | nil | | Nil | nil | nil | (1) 0.025 g | nil | (W1) 0.03 g | EL/EEP =8/2 |
| 10 | (A-48) 10 g | | (IIIs-1) 0.5 g | | nil | | Nil | nil | nil | (1) 0.025 g | (1) 0.03 g | (W4) 0.03 g | EL/EEP =8/2 |
| 11 | (A-49) 10 g | | (IVs-2) 0.5 g | | nil | | Nil | nil | nil | (4) 0.015 g | nil | (W2) 0.03 g | EL/EEP =8/2 |
| 12 | (A-51) 10 g | | (Vs-3) 0.5 g | | nil | | Nil | nil | nil | (3) 0.01 g | nil | (W4) 0.05 g | EL/EEP =8/2 |
| 13 | (A-3) 10 g | | (Is-3) 0.2 g | | (C-2) 0.3 g | | Nil | nil | nil | (2) 0.02 g | nil | (W4) 0.05 g | PGMEA/PGME =8/2 |
| 14 | (A-7) 10 g | | (Is-5) 0.6 g | | (C-3) 0.1 g | | Nil | nil | nil | (2) 0.025 | nil | (W4) 0.05 g | EL/EEP =8/2 |
| 15 | (A-22) 10 g | | (IIs-1) 0.2 g | | (C-4) 0.5 g | | Nil | nil | nil | (1) 0.025 g | nil | (W2) 0.03 g | EL/EEP =8/2 |
| 16 | (A-25) 10 g | | (IIs-28) 0.1 g | | (C-5) 0.3 g | | Nil | nil | nil | (1) 0.025 g | nil | (W2) 0.03 g | CH |
| 17 | (A-36) 10 g | | (IIs-29) 0.2 g | | (C-1) 0.4 g | | Nil | (B'-1) 0.1 g | nil | (4) 0.005 g | nil | (W4) 0.05 g | PGMEA/PGME =8/2 |
| 18 | (A-38) 10 g | | (IIIs-1) 0.5 g | | (C-2) 0.2 g | | Nil | (B'-2) 0.2 g | nil | (3) 0.005 g | nil | (W1) 0.03 g | PGMEA/PGME =8/2 |
| 19 | (A-41) 10 g | | (IIs-1) 0.4 g | | nil | | Nil | (B'-3) 0.2 g | nil | nil | nil | (W2) 0.03 g | PGMEA/PGME =8/2 |
| 20 | (A-43) 10 g | | (IIs-18) 0.5 g | | nil | | Nil | (B'-4) 0.4 g | nil | nil | nil | (W3) 0.03 g | PGMEA/PGME =8/2 |
| 21 | (A-35) 10 g | | (IIIs-1) 0.2 g | | | | Nil | (B'-2) 0.2 g | nil | (1) 0.03 g | nil | (W4) 0.03 g | PGMEA/PGME =8/2 |
| 22 | (A-48) 9 g | | (IIs-1) 0.2 g | | (C-1) 0.1 g (C-2) 0.3 g | | Nil | Nil | (D-1) 1 g | (1) 0.025 g (2) 0.025 g | nil | (W1) 0.03 g | PGMEA/PGME =8/2 |
| 23 | (A-49) 10 g | | (IVs-1) 0.4 g | | (C-3) 0.2 g (C-4) 0.4 g | | Nil | Nil | nil | (2) 0.1 g | nil | (W4) 0.03 g | PGMEA/BL =8/2 |
| 24 | (A-51) 9 g | | (IIs-1) 0.7 g | | (C-3) 0.2 g | | Nil | (B'-4) 0.03 g | (D-1) 1 g | (1) 0.06 g | nil | (W2) 0.03 g | PGMEA/BL =8/2 |
| 25 | (A-25) 10 g | | (IIs-29) 0.25 g (IIs-1) 0.25 g | | | | Nil | Nil | nil | (1) 0.025 g | (1) 0.03 g | (W4) 0.05 g | PGMEA/BL =8/2 |
| 26 | (A-36) 10 g | | (IIs-1) 0.5 g | | | | Nil | Nil | nil | (1) 0.025 g | nil | (W1) 0.03 g | PGMEA |
| 27 | (A-38) 10 g | | (IIs-39) 0.7 g | | | | Nil | Nil | nil | (4) 0.015 g | nil | (W4) 0.03 g | PGMEA |
| 28 | (A-41) 10 g | | (IVs-2) 0.3 g | | | | Nil | Nil | nil | (3) 0.01 g | nil | (W2) 0.03 g | PGMEA |
| 29 | (A-43) 10 g | | (Vs-3) 0.4 g | | | | Nil | Nil | nil | (2) 0.02 g | nil | (W4) 0.05 g | PGMEA |
| 30 | (A-25) 10 g | | (Is-1) 0.25 g (IIs-1) 0.25 g | | | | Nil | Nil | nil | (1) 0.025 g | nil | (W4) 0.05 g | PGMEA |
| 31 | (A-38) 4 g (A-3) 6 g | | (IIs-1) 0.03 g | | (C-4) 0.3 g | | (2) 0.1 g (3) 0.05 g | Nil | nil | nil | (1) 0.03 g | (W1) 0.05 g | PGMEA/PGME =8/2 |
| 32 | (A-38) 5 g (A-3) 5 g | | (Is-1) 0.04 g | | (C-2) 0.3 g | | (2) 0.1 g | Nil | nil | nil | (2) 0.03 g | (W1) 0.05 g | PGMEA/PGME =8/2 |
| 33 | (A-38) 5 g (A-3) 5 g | | (IIs-1) 0.03 g | | (C-2) 0.15 g (C-4) 0.15 g | | (2) 0.1 g (3) 0.05 g | Nil | nil | nil | (1) 0.03 g | (W1) 0.05 g | PGMEA/PGME =8/2 |

TABLE 1-continued

| Example | (A) | | (B) | (C1) | | (C2) | (C3) | (D) | (F) | (F') | (G) | (H) |
|---|---|---|---|---|---|---|---|---|---|---|---|---|
| Comparative Example | | | | | | | | | | | | |
| 1 | (A-3) | 10 g | Nil | (C-3) | 0.5 g | nil | Nil | nil | (1) 0.025 g | nil | (W1) 0.03 g | PGMEA |
| 2 | (A-36) | 10 g | Nil | (C-1) | 0.4 g | nil | (B'-1) 0.1 g | nil | (4) 0.005 g | nil | (W4) 0.05 g | PGMEA/PGME =8/2 |
| 3 | (A-48) | 9 g | nil | (C-1) (C-2) | 0.1 g 0.3 g | nil | nil | (D-1) 1 g | (1) 0.025 g (2) 0.025 g | nil | (W4) 0.05 g | PGMEA/PGME =8/2 |
| 4 | (A-3) | 10 g | nil | (C-6) | 0.5 g | nil | nil | nil | (1) 0.025 g | nil | (W4) 0.05 g | PGMEA |

(A): Resin
(B): Photo-acid generator
(C1): Photo-acid generator
(C2): Photo-acid generator
(C3): Photo-acid generator
(D): Dissolution-inhibiting compound
(F): Basic compound
(F'): Basic compound
(G): Surfactant
(H): Solvent Remarks for the components shown in Table 1:

Component (A): Resin
The amount is indicated as a solid content.
Component (C1): Photo-acid generator generating a sulfonic acid
(C-1): (PAG4-5) shown above
(C-2): (PAG4-4) shown above
(C-3): (PAG4-1) shown above
(C-4): (PAG7-2) shown above
(C-5): Photo-acid generator generating a sulfonic acid, which has the following formula:

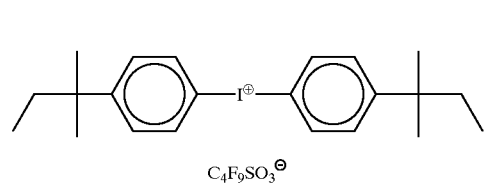

(C-6): (PAG4-3) shown above
Component (C2): Photo-acid generator generating a carboxylic acid
(1): (I-1) shown above
(2): (II-1) shown above
(3): (II-7) shown above Component (C3): Photo-acid generator generating a carboxylic acid

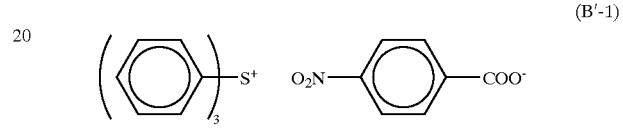

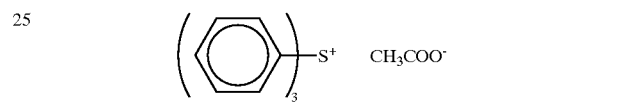

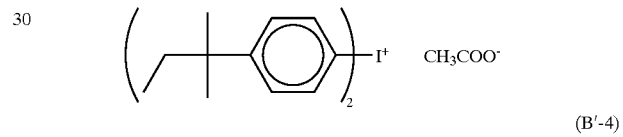

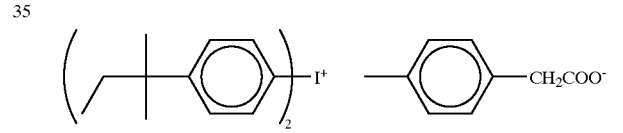

Component (D): Dissolution-inhibiting compound
(D-1): Compound having the following formula:

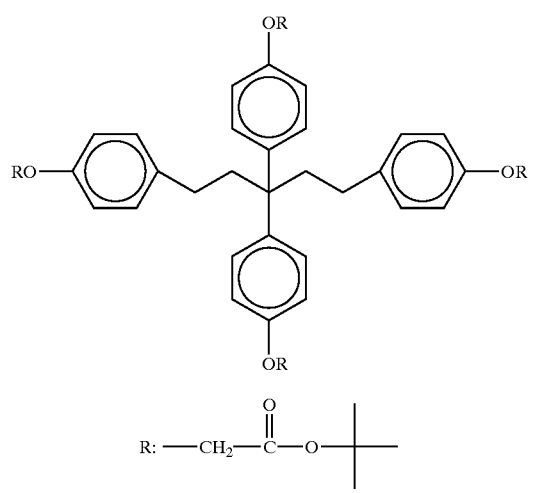

Component (F): Basic compound
(1): 1,5-Diazabicyclo[4.3.0]-5-nonene (2): 2,4,5-Triphenylimidazole
(3): Tri-n-butylamine
(4): N-Hydroxyethylpiperidine
Component (F'): Basic compound
(1): Benzoyl phenyl hydroxylamine
(2): Benzoyl tolyl hydroxylamine
Component (G): Surfactant
  (W-1): Megafac F176 (manufactured by Dainippon Ink and Chemicals, Inc.) (fluorine-base)
  (W-2): Megafac R08 (manufactured by Dainippon Ink and Chemicals, Inc.) (fluorine- and silicon-base)
  (W-3): Polysiloxane Polymer KP-341 (manufactured by Shin-Etsu Chemical Co., Ltd.)
  (W-4): Troysol S-366 (manufactured by Troy Chemical Co., Ltd.) (silicon-base)
Component (H): Solvent
  PGMEA: propylene glycol monomethyl ether acetate
  PGME: propylene glycol monomethyl ether (1-methoxy-2-propanol)
  EL: Ethyl lactate
  EEP: Ethyl ethoxypropionate
  BL: γ-Butyrolactone
  CH: Cyclohexanone A ratio of the plural solvents used is indicated as a weight ratio in Table 1.

TABLE 2

| | Resolution (μm) | Extraneous Substance On Surface | Profile | Depth of Focus (μm) |
|---|---|---|---|---|
| Example | | | | |
| 1 | 0.13 | ○ | ○ | 0.7 |
| 2 | 0.13 | ○ | ○ | 0.7 |
| 3 | 0.13 | ○ | ○ | 0.7 |
| 4 | 0.13 | ○ | ○ | 0.7 |
| 5 | 0.125 | ○ | ○ | 0.6 |
| 6 | 0.125 | ○ | ○ | 0.7 |
| 7 | 0.125 | ○ | ○ | 0.65 |
| 8 | 0.125 | ○ | ○ | 0.7 |
| 9 | 0.14 | ○ | ○ | 0.65 |
| 10 | 0.14 | ○ | ○ | 0.7 |
| 11 | 0.14 | ○ | ○ | 0.7 |
| 12 | 0.14 | ○ | ○ | 0.65 |
| 13 | 0.13 | ○ | ○ | 0.7 |
| 14 | 0.13 | ○ | ○ | 0.7 |
| 15 | 0.125 | ○ | ○ | 0.7 |
| 16 | 0.125 | ○ | ○ | 0.65 |
| 17 | 0.125 | ○ | ○ | 0.7 |
| 18 | 0.125 | ○ | ○ | 0.65 |
| 19 | 0.125 | ○ | ○ | 0.7 |
| 20 | 0.13 | ○ | ○ | 0.65 |
| 21 | 0.13 | ○ | ○ | 0.7 |
| 22 | 0.14 | ○ | ○ | 0.7 |
| 23 | 0.14 | ○ | ○ | 0.7 |
| 24 | 0.14 | ○ | ○ | 0.7 |
| 25 | 0.125 | ○ | ○ | 0.65 |
| 26 | 0.125 | ○ | ○ | 0.65 |
| 27 | 0.125 | ○ | ○ | 0.7 |
| 28 | 0.125 | ○ | ○ | 0.7 |
| 29 | 0.125 | ○ | ○ | 0.65 |
| 30 | 0.125 | ○ | ○ | 0.7 |
| 31 | 0.14 | ○ | ○ | 0.75 |
| 32 | 0.125 | ○ | ○ | 0.75 |
| 33 | 0.125 | ○ | ○ | 0.75 |
| Comparative Example | | | | |
| 1 | 0.14 | X | X | 0.3 |
| 2 | 0.14 | X | X | 0.3 |
| 3 | 0.14 | X | X | 0.3 |
| 4 | 0.14 | X | X | 0.4 |

From the results shown in Table 2 above, it can be seen that the positive resist composition of the present invention has good resolution, provides a good profile without extraneous substances on surface and exhibits a broad range in depth of focus.

While the invention has been described in detail and with reference to specific examples thereof, it will be apparent to one skilled in the art that various changes and modifications can be made therein without departing from the spirit and scope thereof.

What is claimed is:

1. A positive resist composition comprising:

(A) a resin capable of decomposing by the action of an acid to increase solubility in an alkali developer and containing a repeating unit represented by formula (IV) and a repeating unit represented by formula (V):

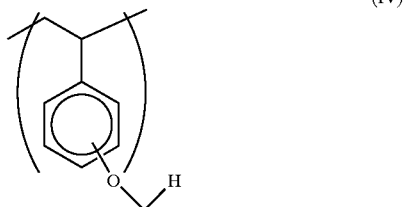

(IV)

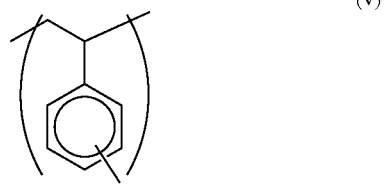

(V)

wherein L represents a hydrogen atom, a straight-chain, branched or cyclic alkyl group which may be substituted or an aralkyl group which may be substituted; Z represents a straight-chain, branched or cyclic alkyl group which may be substituted or an aralkyl group which may be substituted; Z and L may be combined with each other to form a 5-membered or 6-membered ring; and (B) a compound selected from the group consisting of formulae (II) and (III) capable of generating an aromatic sulfonic acid substituted with at least one group containing a fluorine atom upon irradiation with one of an actinic ray and radiation:

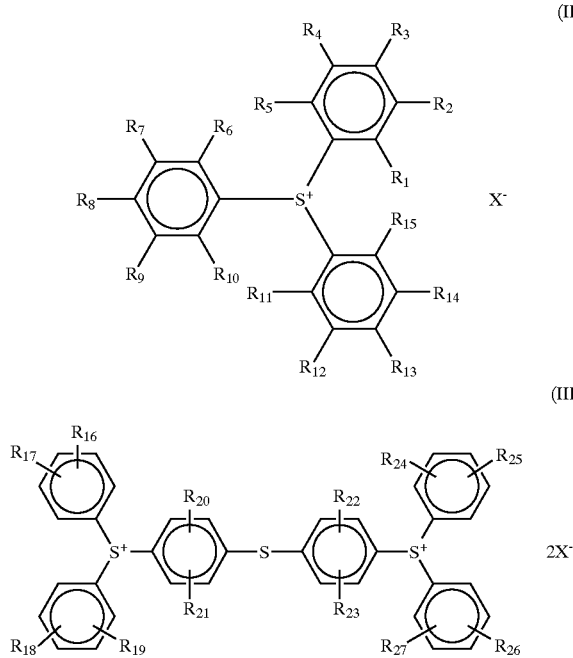

wherein R₁ to R₂₇, which are the same or different, each represents a hydrogen atom, a straight-chain, branched or cyclic alkyl group, a straight-chain, branched or cyclic alkoxy group, a hydroxy group, a halogen atom or an —S—R₃₈ group; R₃₈ represents a straight-chain, branched or cyclic alkyl group or an aryl group; and X— represents an anion of an aromatic sulfonic acid substituted with at least one fluorine atom-containing group.

2. The positive resist composition as claimed in claim 1, which further comprises (D) a compound having a molecular weight of not more than 3,000 which is capable of decomposing by the action of an acid to increase solubility in an alkali developer.

3. The positive resist composition as claimed in claim 1, which further comprises (F) a nitrogen-containing basic compound.

4. The positive resist composition as claimed in claim 1, which further comprises (G) a surfactant containing at least one of a fluorine atom and a silicon atom.

5. The positive resist composition as claimed in claim 1, wherein X— in formula (II) or (III) represents an anion of an aromatic sulfonic acid substituted with at least one perfluoro alkyl group.

6. The positive resist composition as claimed in claim 1, wherein Z in formula (IV) represents a substituted alkyl group or a substituted aralkyl group.

7. The positive resist composition as claimed in claim 1, wherein the resin (A) comprises:

a first resin containing a repeating unit represented by formula (IV), wherein Z in formula (IV) represents a substituted alkyl group or a substituted aralkyl group, and a repeating unit represented by formula (V); and a second resin containing a repeating unit represented by formula (IV), wherein Z in formula (IV) represents an alkyl group, and a repeating unit represented by formula (V).

8. The positive resist composition as claimed in claim 1, which further comprises (C) a compound other than the compound (B), which is capable of generating an acid upon irradiation with one of an actinic ray and radiation.

9. The positive resist composition as claimed in claim 8, wherein the compound (C) comprises (C1) a compound other than the compound of component (B), which is capable of generating a sulfonic acid upon irradiation with one of an actinic ray and radiation.

10. The positive resist composition as claimed in claim 8, wherein the compound (C) contains a compound capable of generating a carboxylic acid upon irradiation with one of an actinic ray and radiation.

11. The positive resist composition as claimed in claim 10, wherein the carboxylic acid is one of a saturated aliphatic carboxylic acid and an aromatic carboxylic acid.

12. The positive resist composition as claimed in claim 11, wherein each of the saturated aliphatic carboxylic acid and the aromatic carboxylic acid is substituted by at least one fluorine atom.

13. The positive resist composition as claimed in claim 1, wherein the group containing a fluorine atom is a hydrocarbon group containing a fluorine atom.

14. The positive resist composition as claimed in claim 13, wherein the hydrocarbon group containing a fluorine atom has 1 to 15 carbon atoms and 1 to 31 fluorine atoms.

15. The positive resist composition as claimed in claim 1, wherein the aromatic sulfonic acid is substituted with at least two hydrocarbon groups containing a fluorine atom.

16. The positive resist composition as claimed in claim 1, wherein the aromatic sulfonic acid is a benzenesulfonic acid.

* * * * *